United States Patent
Hou et al.

(10) Patent No.: US 10,616,053 B2
(45) Date of Patent: Apr. 7, 2020

(54) MULTI-STAGE RECONFIGURABLE TRIPLEXER

(71) Applicant: SKYWORKS SOLUTIONS, INC., Woburn, MA (US)

(72) Inventors: Yang Hou, Santa Clara, CA (US); Reza Kasnavi, Solana Beach, CA (US); Jianxing Ni, San Jose, CA (US); Shanshan Zhao, Santa Clara, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/366,435

(22) Filed: Dec. 1, 2016

(65) Prior Publication Data
US 2017/0163298 A1    Jun. 8, 2017

Related U.S. Application Data

(60) Provisional application No. 62/263,428, filed on Dec. 4, 2015, provisional application No. 62/263,625, filed
(Continued)

(51) Int. Cl.
| | |
|---|---|
| *H04L 12/24* | (2006.01) |
| *H04B 1/00* | (2006.01) |
| *H03F 3/24* | (2006.01) |

(52) U.S. Cl.
CPC .......... *H04L 41/0816* (2013.01); *H03F 3/24* (2013.01); *H04B 1/006* (2013.01); *H04B 1/0057* (2013.01); *H04L 41/0823* (2013.01)

(58) Field of Classification Search
CPC .... H04B 1/0483; H04B 1/0475; H04B 1/006; H04B 1/0057; H04B 2001/0408; H03F 3/24; H04L 41/0823; H04L 41/0816
See application file for complete search history.

(56) References Cited

U.S. PATENT DOCUMENTS

| | | |
|---|---|---|
| 4,210,881 A | 7/1980 | Rubin |
| 7,075,388 B2 | 7/2006 | Rogozine et al. |

(Continued)

FOREIGN PATENT DOCUMENTS

| | | |
|---|---|---|
| KR | 10-2011-0093315 A | 8/2011 |
| WO | WO 2004-012354 A1 | 2/2004 |

OTHER PUBLICATIONS

International Search Report and Written Opinion dated Mar. 22, 2017 in corresponding PCT Application No. PCT/US2016/064851, 9 pgs.

*Primary Examiner* — Alex Skripnikov
*Assistant Examiner* — Sharmin Chowdhury
(74) *Attorney, Agent, or Firm* — Knobbe, Martens, Olson & Bear, LLP

(57) ABSTRACT

A reconfigurable triplexer that can support more frequency bands than a traditional triplexer is disclosed. For example, the reconfigurable triplexer can handle frequencies of several hundred megahertz up to 10 gigahertz. Further, certain implementations of the reconfigurable multiplexer can reduce or eliminate frequency dead zones that exist with traditional multiplexers. The reconfigurable triplexer includes a multi-stage filter bank capable of supporting a number of frequency bands and a bypass circuit that enables the triplexer to support a variety of sets of frequencies. For instance, unlike traditional triplexers, the reconfigurable triplexer can support both frequency bands with relatively narrow spacing and frequency bands with relatively wide spacing. Further, the inclusion of the bypass circuit enables the reduction or elimination of dead zones between supported frequencies.

21 Claims, 14 Drawing Sheets

Related U.S. Application Data on Dec. 5, 2015, provisional application No. 62/350,355, filed on Jun. 15, 2016.

(56) References Cited

U.S. PATENT DOCUMENTS

| | | | |
|---|---|---|---|
| 2004/0046621 A1* | 3/2004 | Furuya | H03H 7/0115 |
| | | | 333/132 |
| 2004/0104785 A1 | 6/2004 | Park et al. | |
| 2004/0203552 A1* | 10/2004 | Horiuchi | H04B 1/005 |
| | | | 455/333 |
| 2007/0007823 A1 | 1/2007 | Huang et al. | |
| 2007/0037515 A1 | 2/2007 | Sakurai et al. | |
| 2008/0136521 A1 | 6/2008 | Chang | |
| 2008/0186106 A1* | 8/2008 | Christian | H03H 7/463 |
| | | | 333/133 |
| 2009/0289871 A1 | 11/2009 | Lin et al. | |
| 2010/0311383 A1* | 12/2010 | Abbaspour-Tamijani | |
| | | | H01P 5/12 |
| | | | 455/340 |
| 2011/0130163 A1 | 6/2011 | Saban et al. | |
| 2012/0178386 A1* | 7/2012 | Pascolini | H04B 1/525 |
| | | | 455/84 |
| 2013/0039227 A1 | 2/2013 | Ji et al. | |
| 2013/0136006 A1* | 5/2013 | Kim | H04L 5/001 |
| | | | 370/241 |
| 2013/0250819 A1* | 9/2013 | Khlat | H04B 1/10 |
| | | | 370/278 |
| 2014/0003300 A1 | 1/2014 | Weissman et al. | |
| 2014/0035700 A1* | 2/2014 | Zeng | H03H 7/01 |
| | | | 333/132 |
| 2014/0133364 A1 | 5/2014 | Weissman et al. | |
| 2014/0203887 A1* | 7/2014 | Murata | H03H 7/38 |
| | | | 333/103 |
| 2014/0273901 A1* | 9/2014 | Liu | H04W 52/0238 |
| | | | 455/226.1 |
| 2014/0321227 A1 | 10/2014 | Syed et al. | |
| 2015/0118977 A1 | 4/2015 | Emmanuel | |
| 2015/0304059 A1* | 10/2015 | Zuo | H04J 1/08 |
| | | | 370/343 |
| 2015/0373711 A1 | 12/2015 | Narathong et al. | |
| 2016/0020862 A1 | 1/2016 | Morshedi et al. | |
| 2016/0150542 A1 | 5/2016 | Tarighat Mehrabani et al. | |
| 2016/0365878 A1 | 12/2016 | Balm et al. | |
| 2017/0005385 A1* | 1/2017 | Khlat | H04B 1/006 |
| 2017/0005639 A1 | 1/2017 | Khlat et al. | |
| 2017/0026685 A1 | 1/2017 | Xiu | |
| 2017/0063404 A1* | 3/2017 | Langer | H04W 72/0453 |
| 2017/0163297 A1 | 6/2017 | Hou et al. | |
| 2017/0163484 A1 | 6/2017 | Hou et al. | |
| 2017/0201369 A1 | 7/2017 | Ella et al. | |
| 2017/0294997 A1* | 10/2017 | Lee | H04L 5/0032 |

* cited by examiner

MULTI-STAGE RECONFIGURABLE TRIPLEXER

RELATED APPLICATIONS

This disclosure claims priority to U.S. Provisional Application No. 62/263,428, which was filed on Dec. 4, 2015 and is titled "RECONFIGURABLE MULTIPLEXER," U.S. Provisional Application No. 62/263,625, which was filed on Dec. 5, 2015 and is titled "RECONFIGURABLE MULTIPLEXER," and U.S. Provisional Application No. 62/350,355, which was filed on Jun. 15, 2016 and is titled "MULTI-STAGE RECONFIGURABLE TRIPLEXER," the disclosures of which are expressly incorporated by reference herein in their entirety for all purposes. Further, this application incorporates by reference, in their entirety and for all purposes, U.S. application Ser. No. 15/366,326, which was filed on Dec. 1, 2016 and is titled "RECONFIGURABLE MULTIPLEXER," and U.S. application Ser. No. 15/366,390, which was filed on Dec. 1, 2016 and is titled "DYNAMIC MULTIPLEXER CONFIGURATION PROCESS." Any and all applications, if any, for which a foreign or domestic priority claim is identified in the Application Data Sheet of the present application are hereby incorporated by reference in their entireties under 37 CFR 1.57.

BACKGROUND

Technical Field

This disclosure relates to multiplexers and, in particular, to a reconfigurable multiplexer.

Description of Related Technology

Often, wireless communication involves sending and receiving signals along a particular communication band. However, in some cases, wireless communication may involve the use of multiple communication bands, which is sometimes referred to as multiband communication and may involve multiband signal processing. Usually, when a wireless device receives a multiband signal, the wireless device will perform carrier aggregation to aggregate the constituent signals. This can result in a wider bandwidth and it can be possible to receive data or communication signals at a higher data rate.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

SUMMARY

Figure 1:
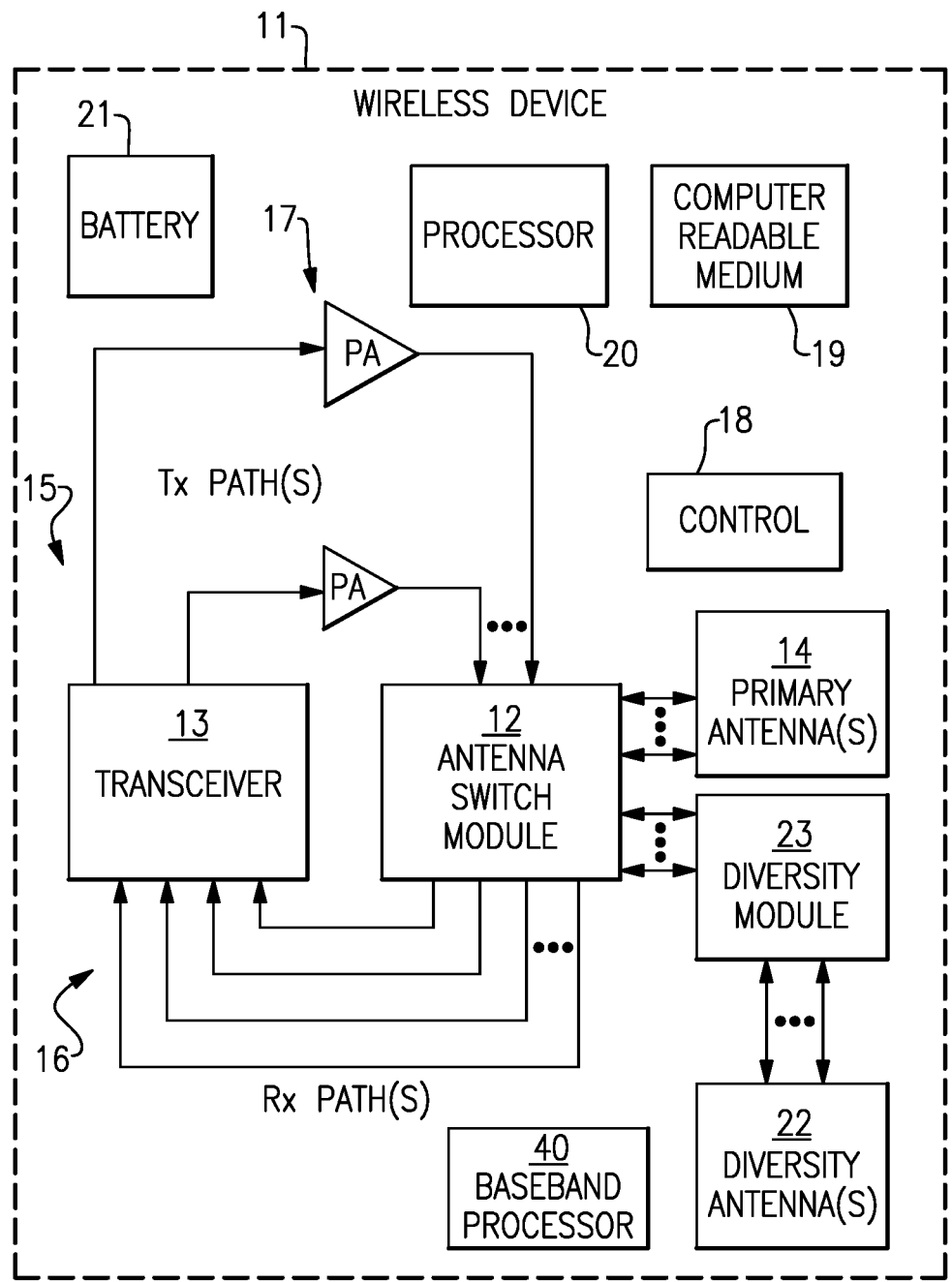
FIG. 1 illustrates a block diagram of an embodiment of a wireless device that includes a transceiver.

The systems, methods and devices of this disclosure each have several innovative aspects, no single one of which is solely responsible for the all of the desirable attributes disclosed herein. Details of one or more implementations of the subject matter described in this specification are set forth in the accompanying drawings and the description below.

Certain aspects of the present disclosure relate to a triplexer. The triplexer may include a first filter bank that includes one or more filters. The first filter bank may be in communication with an input port of the triplexer. The second filter bank may include one or more filters and may be positioned between the first filter bank and a switch bank. The switch bank may include a plurality of switches that connect the one or more filters of the second filter bank to a load circuit from a plurality of load circuits. Further, the triplexer may include a bypass circuit that includes at least one bypass path between the first filter bank and the switch bank enabling a signal to bypass the second filter bank.

In some embodiments, the first filter bank includes a low pass filter and a high pass filter. Further, the second filter bank may include a low pass filter and a high pass filter. In some cases, at least one filter of the first filter bank and at least one filter of the second filter bank are connected in cascade. Moreover, in some cases, the first filter bank and the second filter bank do not include a band pass filter. In some implementations, the first filter bank and the second filter bank are connected in series with one or more additional filter bank stages.

The triplexer may, in some implementations, include the plurality of load circuits. Further, the switch bank may selectively connect a filter from the second filter bank to the load circuit from the plurality of load circuits based at least in part on a control signal from a baseband processor. Moreover, the triplexer may include a bypass switch between the first filter bank and the bypass circuit. This bypass switch may be closed when a non-carrier aggregation signal is received.

With some implementations, a first filter from the first filter bank may be connected to the switch bank without being connected to the second filter bank and a second filter from the first filter bank may be connected to the second filter bank. Moreover, the triplexer may include a second bypass circuit. The bypass circuit may be configured with respect to a first frequency band and the second bypass circuit may be configured with respect to a second frequency band. In some cases, the bypass circuit is a phase shift network.

In addition, the triplexer may include a plurality of input ports including the input port. Each input port, or at least some of the input ports, of the plurality of input ports may be configured to receive a signal of a different frequency band.

Other aspects of the present disclosure relate to a transceiver. The transceiver may include a power amplifier module that includes a plurality of power amplifiers and a triplexer in communication with the power amplifier module. The triplexer may include a first filter bank, a second filter bank, a switch bank, and a bypass circuit. The first filter bank may be in communication with an input port and may include one or more filters. The second filter bank may be positioned between the first filter bank and the switch bank and may include one or more filters. The switch bank may include a plurality of switches that connect the one or more filters of the second filter bank to a load circuit from a plurality of load circuits. Further, the bypass circuit may include at least one bypass path between the first filter bank and the switch bank enabling a signal to bypass the second filter bank.

In certain embodiments, the plurality of load circuits includes a first set of load circuits selectively connectable to the bypass circuit based on a control signal. Further, the plurality of load circuits may include a second set of load circuits selectively connectable to the second filter bank based on a control signal. At least one filter of the first filter bank may be connected in series with at least one filter of the second filter bank. Further, the first filter bank and the second filter bank may omit a band pass filter.

Yet other aspects of the present disclosure relate to a wireless device. The wireless device may include a transceiver and a baseband processor. The transceiver may include a power amplifier module and a triplexer. The power amplifier module may include a plurality of power amplifiers. Further, the triplexer may be in communication with the power amplifier module. Moreover, the triplexer may include a first filter bank, a second filter bank, a switch bank, and a bypass circuit. The first filter bank may be in communication with an input port of the triplexer and may include one or more filters. The second filter bank may be positioned between the first filter bank and the switch bank, and may include one or more filters. The switch bank may include a plurality of switches that selectively connect the one or more filters of the second filter bank to a load circuit from a plurality of load circuits based on a control signal. The bypass circuit may include at least one bypass path between the first filter bank and the switch bank enabling a signal to bypass the second filter bank. Further, the baseband processor may be configured to provide the control signal to the triplexer. The control signal may be determined based at least in part on a communication from a base station.

Certain aspects of the present disclosure relate to a multiplexer. The multiplexer may include a filter bank that includes a plurality of filters. Further, the multiplexer may include a bypass circuit that includes at least one bypass path between an input of the multiplexer and an output of the multiplexer. This bypass path may not include the filter bank. Moreover, the multiplexer may also include a first switch that electrically connects a filter from the plurality of filters based at least in part on a control signal and a second switch that electrically connects the at least one bypass path based at least in part on the control signal.

In addition, the multiplexer may include a plurality of load circuits. In some cases, the first switch is configured to electrically connect the filter to a load circuit from the plurality of load circuits based at least in part on the control signal. Further, at least two load circuits from the plurality of load circuits may be selectable by the first switch to be electrically connected to the filter and the load circuit is selected from the at least two load circuits based at least in part on the control signal. Additionally, the second switch may be configured to electrically connect the at least one bypass path to a load circuit from the plurality of load circuits based at least in part on the control signal. At least two load circuits from the plurality of load circuits may be selectable by the second switch to be electrically connected to the bypass path and the load circuit may be selected from the at least two load circuits based at least in part on the control signal. In some implementations, at least one load circuit from the plurality of load circuits includes an LC circuit.

Further, in some implementations, the first switch is configured to electrically connect the filter to an antenna based at least in part on the control signal. Moreover, the second switch may be configured to electrically connect the bypass path to an antenna based at least in part on the control signal. The bypass circuit may include a phase shift network. Alternatively, or in addition, the bypass circuit may include a transmission line. In some cases, the plurality of filters may include at least one high pass filter, band pass filter, or low pass filter.

Other aspects of the present disclosure relate to a transceiver. This transceiver may include a power amplifier module and a multiplexer. The power amplifier module may include a plurality of power amplifiers. The multiplexer may include a filter bank that includes a plurality of filters, a bypass circuit, a first switch, and a second switch. The bypass circuit may include at least one bypass path between an input of the multiplexer and an output of the multiplexer. The bypass path generally does not include the filter bank within the signal path. The first switch may electrically connect a filter from the plurality of filters based at least in part on a control signal. The second switch may electrically connect the at least one bypass path based at least in part on the control signal.

Further, the multiplexer may include a plurality of load circuits. In some such cases, the first switch may be configured to electrically connect the filter to a load circuit from the plurality of load circuits based at least in part on the control signal. The first switch may select the load circuit to electrically connect to the filter from at least two load circuits capable of being electrically connected to the filter. With some implementations, the second switch may be configured to electrically connect the at least one bypass path to a load circuit from the plurality of load circuits based at least in part on the control signal. The second switch may select the load circuit to electrically connect to the bypass path from at least two load circuits capable of being electrically connected to the bypass path.

Yet other aspects of the present disclose relate to a wireless device. The wireless device may include a transceiver and a baseband processor. The transceiver may include a power amplifier module and a multiplexer. The power amplifier module may include a plurality of power amplifiers and the multiplexer may be in communication with the power amplifier module. The multiplexer may include a filter bank that includes a plurality of filters, a bypass circuit, a first switch, and a second switch. The bypass circuit may include at least one bypass path between an input of the multiplexer and an output of the multiplexer. Generally, the bypass path does not include the filter bank. The first switch may be electrically connected to a filter from the plurality of filters based at least in part on a control signal. The second switch may be electrically connected to the at least one bypass path based at least in part on the control signal. Further, the baseband processor may be configured to provide the control signal to the multiplexer. The control signal may be determined based at least in part on a communication from a base station.

In some embodiments, the multiplexer further includes a load circuit in electrical communication with one of the filter or the bypass path. The load circuit may be configured to increase isolation of a signal received by the multiplexer.

Certain aspects of the present disclosure relate to a method of dynamically configuring a multiplexer. The method may include receiving a control signal from a base station. This control signal may identify at least one communication frequency. Further, the method may include determining whether the control signal identifies a plurality of communication frequencies. In response to determining that the control signal identifies the plurality of communication frequencies, the method may include configuring a filter bank of the multiplexer based at least in part on the plurality of communication frequencies. The filter bank may include a plurality of filters. Further, the method may include determining whether the plurality of communication frequencies are associated with a set of special carrier aggregation bands. In response to determining that the plurality of communication frequencies are associated with the set of special carrier aggregation bands, the method may include selecting a load circuit from a plurality of load circuits included in the multiplexer based on the plurality of communication frequencies and connecting a bypass path included in the multiplexer to the load circuit.

Configuring the filter bank may include accessing a lookup table to identify switch configurations for a switch bank of the multiplexer and configuring the switch bank based on the identified switch configurations. Further, in response to determining that the plurality of communication frequencies are associated with the set of special carrier aggregation bands, the method may further include disconnecting a remainder of additional bypass paths included in the multiplexer. In some cases, the set of special carrier aggregation bands include a plurality of frequency bands with less than a threshold frequency spacing between the bands. The threshold frequency spacing may be approximately 150 megahertz. Other threshold frequency spacings are possible. For example, the threshold frequency spacing may be 100 megahertz, 200 megahertz, 500 megahertz, and the like.

In certain implementations, in response to determining that the control signal identifies the plurality of communication frequencies, the method further includes determining whether the plurality of communication frequencies are associated with a set of common carrier aggregation bands. In response to determining that the plurality of communication frequencies are associated with the set of common carrier aggregation bands, the method includes disconnecting the bypass path. The set of common carrier aggregation bands may include a plurality of frequency bands with greater than a threshold frequency spacing between the bands. Further, the threshold frequency spacing may be approximately 150 megahertz. As previously discussed, other threshold frequency spacings are possible. In some cases, the set of common carrier aggregation bands include a plurality of frequency bands with an isolation requirement of approximately 20 decibels. In some embodiments, the isolation requirement may be less than or greater than 20 decibels.

In response to determining that the control signal identifies a single communication frequency, the method may further include connecting a first filter corresponding to the single communication frequency from the filter bank to an output port of the multiplexer and disconnecting remaining signal paths within the multiplexer. The remaining signal paths may include a first signal path that includes a second filter that does not correspond to the single communication frequency and a second signal path that corresponds to the bypass path. Moreover, in response to determining that the control signal identifies an unsupported signal, the method may further include deactivating the filter bank and connecting the bypass path to an output port of the multiplexer. Further, the method may include disconnecting remaining bypass paths of the multiplexer.

Other aspects of the present disclosure relate to a method of dynamically configuring a multi-stage multiplexer. The method may include receiving at a multiplexer a control signal from a baseband processor. The control signal may identify a frequency band. Further, the method may include configuring a filter bank of the multiplexer based at least in part on the control signal. Configuring the filter bank may include configuring a first filter stage of the filter bank based at least in part on the frequency band and configuring a second filter stage of the filter bank based at least in part on the frequency band. The first filter stage may be configured to filter a signal to obtain a partially filtered signal. Further, the second filter stage may be configured to filter the partially filtered signal to obtain a filtered signal of the frequency band. The method may further include configuring a bypass circuit of the multiplexer based at least in part on the control signal.

In some cases, the control signal is based on a second control signal received from a base station. Further, the bypass circuit may be part of the second filter stage. Moreover, the method may further include determining based at least in part on the control signal whether the multiplexer is to operate in a carrier aggregation mode. In response to determining that the multiplexer is to operate in a carrier aggregation mode, configuring the bypass circuit may further include disconnecting the bypass circuit from an operational signal path of the filter bank. Alternatively, in response to determining that the multiplexer is to operate in a carrier aggregation mode, configuring the bypass circuit may include connecting the bypass circuit to a filter from the first filter stage.

In response to determining based at least in part on the control signal that the multiplexer is to operate in a bypass mode, configuring the second filter stage may include disconnecting the second filter stage from the first filter stage. Further, the method may include selecting a set of load circuits from a plurality of available load circuits included in the multiplexer based at least in part on the control signal and connecting a set of filter output paths from the filter bank to the set of load circuits.

Although certain embodiments and examples are disclosed herein, inventive subject matter extends beyond the examples in the specifically disclosed embodiments to other alternative embodiments and/or uses, and to modifications and equivalents thereof.

DETAILED DESCRIPTION

Introduction

Some wireless devices support communication over multiple radio frequency (RF) bands. In some cases, a wireless device may communicate over multiple frequency or RF bands at the same time. Communicating over multiple frequency bands may include a wireless device transmitting data and/or voice (e.g., audio data) synchronously over multiple communication bands. This synchronous or simultaneous transmission over multiple RF bands may be referred to as uplink carrier aggregation or carrier aggregation uplink ("CAUL"). Using CAUL may enable transmission at higher data rates because, for example, each carrier may transmit some of the data. Thus, for example, in some cases, instead of a single carrier transmitting data at rate X, two carriers can transmit data together at a rate of up to 2X. Devices that are capable of CAUL typically include at least two power amplifiers transmitting signals at the same time. The signals may be combined and transmitted together over a single communication connection using, for example, time division duplex (TDD) communication, which can communicate both carriers together over a single uplink connection.

Not only can some devices transmit over multiple bands, but some devices may also receive communications over multiple frequency or RF bands. Such devices may include multiple low noise amplifiers (LNA) that are capable of amplifying particular frequency bands of the received multiple frequency signal. Wireless devices that support carrier aggregation often include a multiplexer to facilitate the aggregation process. Typically, the multiplexer is a bidirectional multiplexer and may be capable of supporting both uplink and downlink carrier aggregation. Carrier aggregation for both uplink and downlink can support multiple communication bands and although in many cases carrier aggregation operates on two frequency bands, the present disclosure is not limited as such. Carrier aggregation as used herein may support two, three, four, or more communication frequency bands.

A traditional multiplexer is designed to handle particular frequencies. Generally, the multiplexer has a fixed or static design and is not capable of handling unanticipated frequency bands. Furthermore, traditional multiplexers are designed for specific applications and cannot satisfy all potential applications because, for example, of competing trade-offs in different application use cases. For example, in cases where wider frequency spacing is desired, lower insertion loss is desired for improved efficiency. However, in cases where narrower frequency spacing is desired, a higher isolation is desired for lower interference between channels. Often, reducing the insertion loss and reducing interference between channels are competing desires and it may be challenging to maximize both factors. Thus, there are often dead zones, or unsupported frequency bands, between the supported frequency bands of traditional multiplexers. Further, the more bands supported by a multiplexer the larger the multiplexer becomes, which competes with a desire to reduce component size. In addition, each additional path added to a multiplexer so as to support additional frequency bands may add to a loading effect on paths not in use. In other words, if the multiplexer receives a signal of a particular frequency, the signal will be processed along a particular path of the multiplexer associated with the received signal. However, because other paths in the multiplexer that are designed to process other frequencies generally cannot be configured as an ideal open or short, the other paths may degrade the performance of the particular path for the received signal. This problem is exacerbated because typically the multiplexer has a fixed design that cannot be tuned or adjusted.

Embodiments described herein relate to a reconfigurable multiplexer that can support more frequency bands compared to traditional multiplexers. For example, the reconfigurable multiplexer can handle frequencies of several hundred megahertz up to 10 gigahertz. Further, certain implementations of the reconfigurable multiplexer of the present disclosure can reduce or eliminate frequency dead zones. In certain embodiments, the reconfigurable multiplexer includes a filter bank capable of supporting a number of frequency bands and a bypass circuit that enables the multiplexer to support a variety of sets of frequencies. For instance, the reconfigurable multiplexer can support both frequency bands with relatively narrow spacing and frequency bands with relatively wide spacing. Frequency bands with relatively narrow spacing (e.g., a few hundred megahertz or less) may require filters that suffer from greater insertion loss due to design constraints. For example, suppose the CA signal combines band 4 and band 30. Band 4 may have a frequency range of 1710 MHz-2155 MHz and Band 30 may have a frequency range of 2305 MHz-2360 MHz resulting in approximately a 150 MHz spacing between frequency bands. A filter designed to process the CA signal may have an insertion loss of higher than 2 dB due to design constraints. Alternatively, frequency bands with relatively wide spacing (e.g., spacing of more than several hundred MHz, such as 500 or 600 MHz) may be supported or processed by filters with a lower insertion loss. For example, support the CA signal combined band 3 and band 7. Band 3 may have a frequency range of 1710 MHz-1880 MHz) and Band 7 may have a frequency range of 2500 MHz-2690 MHz resulting in approximately a 620 MHz spacing between frequency bands. A filter designed to process the CA signal may have an insertion loss of less than 1 dB. Further, the inclusion of the bypass circuit enables the reduction or elimination of dead zones between supported frequencies.

In addition, in certain embodiments disclosed herein, the multiplexer includes a number of load circuits. These load circuits enable the reduction of cross-channel interference, or the loading effect, from one communication channel to another. Advantageously, this reduction in the loading effect enables the multiplexer to support frequency bands that have narrow spacing. Moreover, the re-configurability of the multiplexer and the inclusion of the bypass circuits and load circuits enable the multiplexer to support a greater number of frequency bands with a lower number of filters compared to a multiplexer that incorporates a separate filter for each desired frequency band. Thus, the combination of the bypass circuit, the load circuits, and a switching network that enables the dynamic configurability of the multiplexer also reduces the size of the multiplexer while supporting more frequency bands compared to other multiplexers that attempt to support a plurality of frequency bands with the inclusion of additional filters.

Several embodiments are described herein with reference to one or more frequencies. In some embodiments, a single frequency is intended. However, in other embodiments, the one or more frequencies may refer to one or more frequency bands, which may each include a range of frequencies. In some cases, the frequency may refer to a central or mid-frequency of a frequency range that constitutes a frequency band.

Example Wireless Device

FIG. 1 illustrates a block diagram of an embodiment of a wireless device 11 that includes a transceiver 13. The example wireless device 11 depicted in FIG. 1 can represent a multi-band and/or multi-mode device such as a multi-band/multi-mode mobile phone or wireless device. Further, the wireless device 11 can support carrier aggregation for both uplink and downlink. By way of example, the wireless device 11 can implement the Global System for Mobile (GSM) communication standard, which is a mode of digital cellular communication that is utilized in many parts of the world. GSM mode capable mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, as many as twenty-two, or in some cases even more, radio frequency spectrum bands.

Radio frequency (RF) modules of the present disclosure can be used within a mobile device implementing the foregoing example modes and/or bands, and in other communication standards. For example, 3G, 4G, LTE, and Advanced LTE are non-limiting examples of such standards.

In certain embodiments, the wireless device 11 can include an antenna switch module 12, a transceiver 13, one or more primary antennas 14, power amplifiers 17, a control component 18, a computer readable medium 19, a processor 20, a baseband processor 40, a battery 21, one or more diversity antennas 22, and a diversity module 23. Further, although not illustrated, several of the components of the wireless device 11 may be implemented within a front-end module (FEM). This FEM may include components in a signal path that are located between the antennas 14 and/or the diversity antennas 22 and a baseband processor 40 of the signal path. For example, the FEM may include the transceiver 13, a power amplifier module that includes the power amplifiers 17, and the antenna switch module 12. In some cases, the FEM may include one or more low noise amplifiers (LNAs).

The transceiver 13 can generate RF signals for transmission via the primary antenna(s) 14 and/or the diversity antenna(s) 22. Furthermore, the transceiver 13 can receive incoming RF signals from the primary antenna(s) and/or the diversity antenna(s) 22. It will be understood that various functionalities associated with transmitting and receiving of RF signals can be achieved by one or more components that are collectively represented in FIG. 1 as the transceiver 13. For example, a single component can be configured to provide both transmitting and receiving functionalities. In another example, transmitting and receiving functionalities can be provided by separate components.

In FIG. 1, one or more output signals from the transceiver 13 are depicted as being provided to the antenna switch module 12 via one or more transmission paths 15. In the example shown, different transmission paths 15 can represent output paths associated with different bands and/or different power outputs. For instance, the two different paths shown can represent paths associated with different power outputs (e.g., low power output and high power output), and/or paths associated with different bands. In some cases, such as with carrier aggregation, multiple transmit paths 15 may be operational at the same time. The transmit paths 15 can include one or more power amplifiers 17 to aid in boosting a RF signal having a relatively low power to a higher power suitable for transmission. The power amplifiers 17 may be included in a power amplifier module (not shown) that includes multiple power amplifiers for supporting different communication bands. Although FIG. 1 illustrates a configuration using two transmission paths 15, the wireless device 11 can be adapted to include more or fewer transmission paths 15.

In FIG. 1, one or more received signals are depicted as being provided from the antenna switch module 12 to the transceiver 13 via one or more receiving paths 16. In the example shown, different receiving paths 16 can represent paths associated with different bands. For example, the four example paths 16 shown can represent quad-band capability that some mobile devices are provided with. Although FIG. 1 illustrates a configuration using four receiving paths 16, the wireless device 11 can be adapted to include more or fewer receiving paths 16. In some cases, such as with carrier aggregation, multiple receive paths 16 may be operational at the same time.

To facilitate switching between receive and/or transmit paths, the antenna switch module 12 can be included and can be used to electrically connect a particular antenna to a selected transmit or receive path. Thus, the antenna switch module 12 can provide a number of switching functionalities associated with an operation of the wireless device 11. The antenna switch module 12 can include one or more multi-throw switches configured to provide functionalities associated with, for example, switching between different bands, switching between different power modes, and switching between transmission and receiving modes, or some combination thereof. In some cases, such as when the antenna switch module 12 is located between the multiplexer and antenna, the antenna switch module can switch between different antennas (e.g., primary antennas 14 or diversity antennas 22, or some combination thereof). The antenna switch module 12 can also be configured to provide additional functionality, including filtering and/or duplexing of signals.

FIG. 1 illustrates that, in certain embodiments, the control component 18 can be provided for controlling various control functionalities associated with operations of the antenna switch module 12, the diversity module 23, and/or other operating component(s). For example, the control component 18 can provide control signals to the antenna switch module 12 and/or the diversity module 23 to control electrical connectivity to the primary antenna(s) 14 and/or diversity antenna(s) 22. Further, the control component 18 can provide control signals to the diversity module to control a sleep state of the diversity module 23, or of elements therein, such as an LDO circuit. Moreover, the control component 18 can provide control signals to the diversity module 23 to control one or more bias voltages provided to elements of the diversity module 23. In some embodiments, the control component 18 can include volatile memory and/or non-volatile memory, such as a read-only memory (ROM) or other computer-readable medium, which can store control states or control instructions implemented by the control component 18. In some cases, the control component 18 can access the computer readable medium 19 to determine control information for the diversity module 23 or other components of the wireless device 11.

In certain embodiments, the baseband processor 40 controls operation of components involved in the receiving or transmitting of signals to and from a base station. For example, the baseband processor 40 may select the PA 17 to operate or the gain level of the selected PA 17 based on control signals or configuration information received from a base station. In some embodiments, the baseband processor 40 may include the control 18.

In certain embodiments, the processor 20 can be configured to facilitate implementation of various processes on the wireless device 11. The processor 20 can be a general purpose computer, special purpose computer, or other programmable data processing apparatus. In certain implementations, the wireless device 11 can include a computer-readable memory 19, which can include computer program instructions that may be provided to and executed by the processor 20.

The battery 21 can be any suitable battery for use in the wireless device 11, including, for example, a lithium-ion battery. The battery 21 may provide a battery voltage to one or more components of the wireless device 11. In some cases, the battery voltage supplied by the battery 21 does not satisfy a required voltage by one or more of the elements of the mobile device 21. For example, some elements may require a higher voltage, while other elements may require a lower voltage. In some such cases, a voltage regulator (e.g., a LDO) may be used to modify a voltage supplied to an element of the wireless device 11.

The illustrated wireless device 11 includes diversity antenna(s) 22, which can help improve the quality and reliability of a wireless link. For example, including the diversity antenna(s) 22 can reduce line-of-sight losses and/or mitigate the impacts of phase shifts, time delays and/or distortions associated with signal interference of the primary antenna(s) 14. In some embodiments, the wireless device 11 can switch between use of a primary antenna 14 and a diversity antenna 23 based at least in part on a quality of a received signal. This quality may be determined by a number of signal properties. For example, if a signal received via the primary antenna 14 is highly attenuated, or attenuated beyond a threshold, the antenna switch module 12 may switch to a diversity antenna 22.

As shown in FIG. 1, the diversity module 23 is electrically connected to the diversity antenna(s) 22. The diversity module 23 can be used to process signals received and/or transmitted using the diversity antenna(s) 22. In certain configurations, the diversity module 23 can be used to provide filtering, amplification, switching, and/or other processing. Further, the diversity module 23 can be used to process a signal before providing the signal to the antenna switch module 12, which can provide the signal to the transceiver 13. In some cases, the diversity module 23 can include a number of switches for switching between high-band (HB) mid-band (MB), and low-band (LB) signals that may be received by and/or transmitted over one or more of the diversity antennas 22.

Example Front-End Module

Figure 2A:
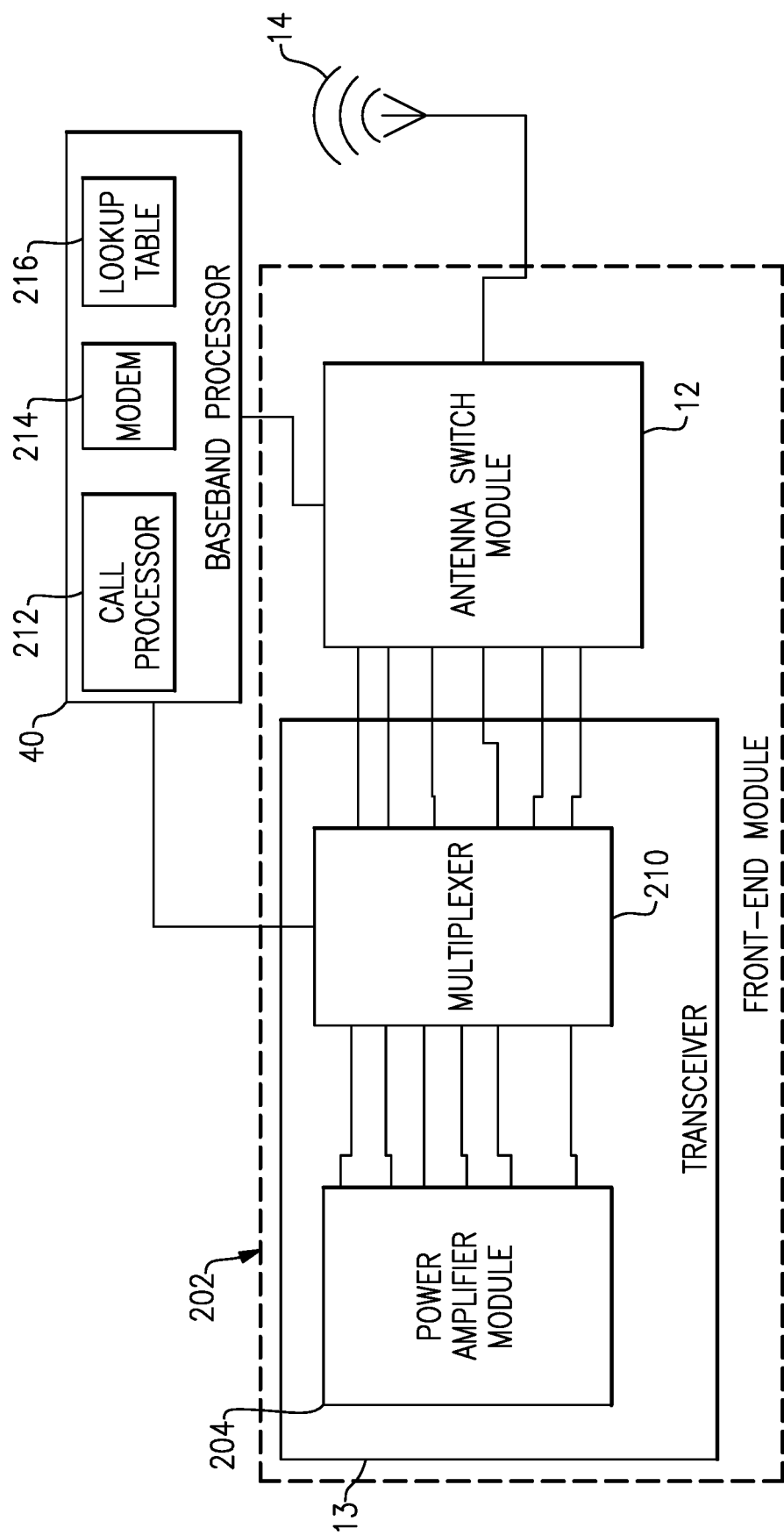
FIG. 2A illustrates a block diagram of an embodiment of a front-end module that includes the transceiver of FIG. 1.

FIG. 2A illustrates a block diagram of an embodiment of a front-end module (FEM) 202 that includes the transceiver 13 of FIG. 1. The FEM 202 also includes the antenna switch module 12. As illustrated in FIG. 2A, the FEM 202 may be positioned between an antenna 14 and a baseband processor 40. Although only one antenna is illustrated, the FEM 202 may be in communication or electrical communication with multiple antennas. In some cases, the FEM 202 may communicate with both primary and diversity antennas.

The transceiver 13 may include a power amplifier module 204 and a multiplexer 210. The power amplifier module 204 generally includes a plurality of power amplifiers (e.g., the power amplifiers 17). Further the power amplifier module 204 may include a controller that controls the operation of the power amplifiers. This controller may activate or deactivate one or more of the power amplifiers. Further, the power amplifier module 204 and/or its controller may include bias circuitry for biasing the plurality of power amplifiers and power control circuitry for controlling the input power provided to a plurality of power amplifiers.

As illustrated in FIG. 2A, the power amplifier module 204 may include a number of output paths. Each of these output paths may be associated with a different power amplifier of the power amplifier module 204. Further, each of the output paths may be associated with a different communication band or transmit band. For example, as illustrated in FIG. 2A, the power amplifier module 204 has six outputs, which may correspond to six different communication bands. At least some of the six communication bands may be aggregated together as part of carrier aggregation (CA) communication. These six paths may be provided to the multiplexer 210, which can provide an output from one or more of the power amplifiers to the antenna switch module 12. In some cases, the output of the multiplexer 210 is provided directly to an antenna 14 and is not provided to the antenna switch module 12.

Figure 2B:
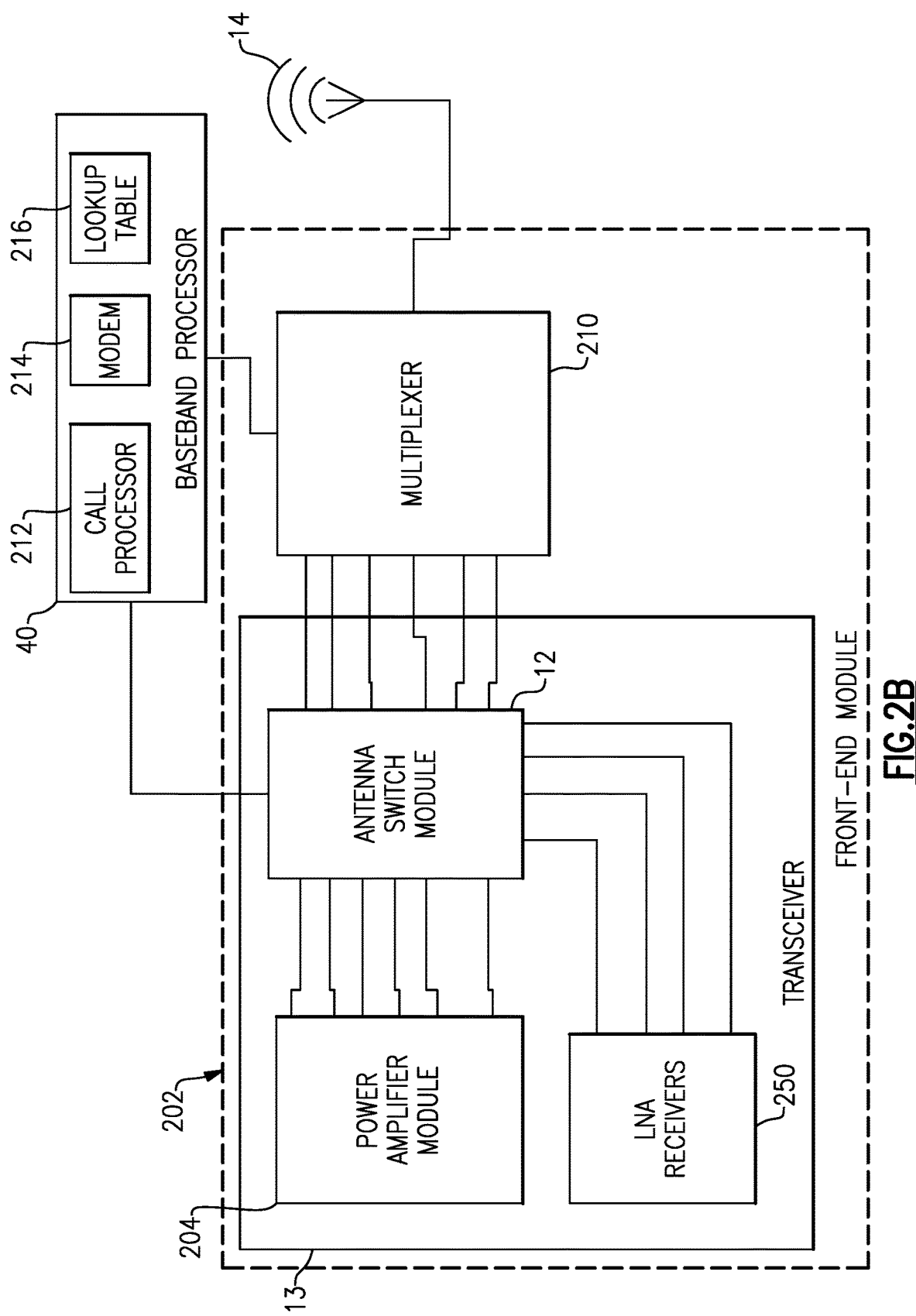
FIG. 2B illustrates a block diagram of an alternative or additional arrangement of a front-end module that includes the transceiver of FIG. 1.

For devices that support carrier aggregation, the multiplexer may be located between the power amplifier module (PAM) 204 and the antenna switch module 12 as illustrated in FIG. 2A. Alternatively, or in addition, as illustrated in FIG. 2B, the multiplexer 210 may be located between the antenna switch module 12 and the antenna 14. The multiplexer 210 may support carrier aggregation (CA) downlink communication and CA uplink (CAUL) communication.

The baseband processor 40 may control the configuration of the multiplexer 210 and/or the antenna switch module 12. The baseband processor 210 may provide a control signal to the multiplexer 210 to select one or more communication paths. Further, the baseband processor 210 may provide a control signal to configure elements of the multiplexer 210, as will be described in more detail below, based on selection of one or more communication bands by a base station. The communication bands may be identified during a handshake process with the base station. Alternatively, or in addition, the base station may identify one or more communication bands during communication with the wireless device that includes the FEM 202.

In addition, the baseband processor may provide a control signal to the antenna switch module 12 to select a transmit path to transmit a signal, or a receive path to receive a signal. Further, the selection of the paths may be based on a selection of a communication band identified by a base station for transmitting or receiving signals from the wireless device 11.

The baseband processor 40 includes a call processor 212 and a modem 214. Further, in some cases, the baseband processor 40 includes a lookup table 218. The modem can perform modulation and demodulation of data and voice for transmission. The call processor 214 may control the timing of communication with the base station. Further, the call processor 214 may control the switches of the antenna switch module 208. In some embodiments, the call processor 214 may also control the power amplifiers of the power amplifier module 202. In addition, as is described in more detail below, the call processor 212 may control the switches of the multiplexer 210. The call processor 212 may determine the configuration of the multiplexer 210 based on information stored in the lookup table 216. This lookup table 216 may be stored in a non-volatile memory, such as a ROM. Further, the call processor 212 may access the information stored in the lookup table 216 based on configuration information provided by the base station.

FIG. 2B illustrates a block diagram of an alternative or additional arrangement of a front-end module 202 that includes the transceiver of FIG. 1. As illustrated in FIG. 2B, the multiplexer 210 may be located between the antenna 14 and the antenna switch module 12. Further, the transceiver may include one or more low noise amplifier (LNA) receivers 250. The LNA receivers 250 may receive and process received signals from the antenna 14 and is typically located within the receive path 16 of the wireless device 11. In contrast, the power amplifier module 204 is generally in the transmit path of the wireless device 11.

In certain embodiments, a multiplexer 210 may be located both between the antenna and the antenna switch module 12 and between the power amplifier module 204 and the antenna switch module 12. Advantageously, in certain embodiments, the multiplexer 210 between the antenna switch module 12 and the power amplifier module 204 may enable the support of transmission via multiple antennas.

Example Multiplexer

Figure 3:
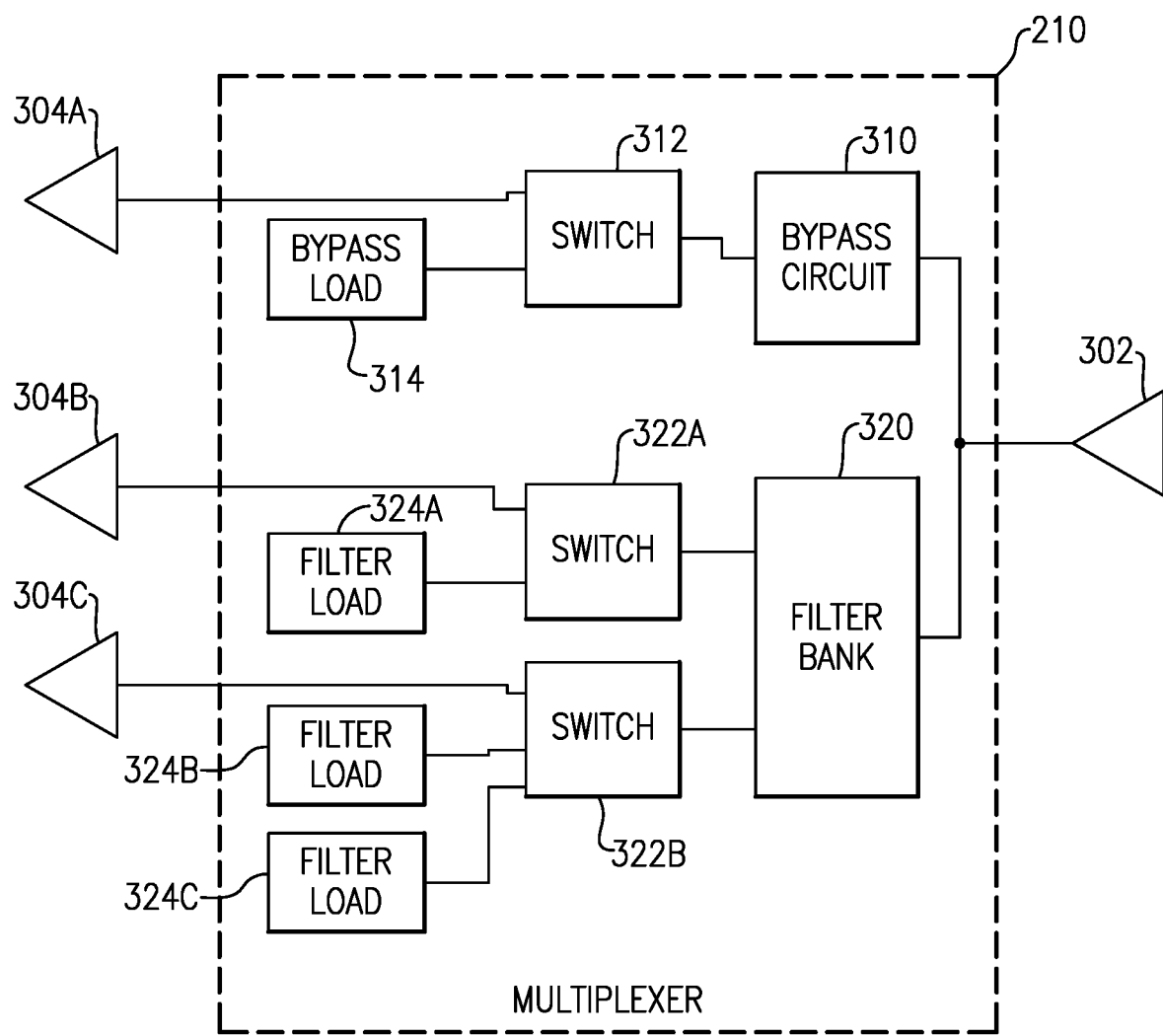
FIG. 3 illustrates a block diagram of an embodiment of the multiplexer of FIG. 2A or 2B.

FIG. 3 illustrates a block diagram of an embodiment of the multiplexer 210 of FIG. 2A. As illustrated, the multiplexer 210 includes a bypass circuit 310 and a filter bank 320. The bypass circuit 310 and filter bank 320 may connect to port 302. This port 302 may be from an antenna 14, and the signal at the port 302 may be a carrier aggregated signal formed from multiple communication bands. Generally, the port 302 may be both an input port and an output port. For example, when the wireless device 11 is receiving a signal, the antenna may provide the received signal to the multiplexer 210 via the port 302 for processing by the multiplexer 210. If on the other hand the wireless device 11 is transmitting a signal, the port 302 may serve as an output port that provides the signal, which may be a CA signal, to an antenna of the wireless device 11 for transmission.

As will be described in more detail below, the configuration of the bypass circuit 310 and the filter bank 320 may be determined based on the communication band or bands being utilized by the wireless device 11. Further, in some cases, only one of the bypass circuit 310 and the filter bank 320 may be operational based on the selected communication bands.

Further, the multiplexer 210 may include a bypass load circuit 314 and one or more filter load circuits 324A, 324B, and 324C (which may collectively be referred to as "filter load circuits 324"). Although only one bypass load circuit 314 is illustrated, in some embodiments, the multiplexer 210 may include multiple bypass load circuits 314. The bypass load circuit 314 and the filter load circuits 324 can be used to reduce, minimize, or eliminate the insertion loss that can occur with the operation of multiple communication paths during carrier aggregation.

The multiplexer 210 can include a switch 312 that switches between the bypass load circuit 314 and the port 304A. Further, in some cases, the bypass circuit 310 may be deactivated. In such cases, the switch 312 may be placed in an open position. Similarly, one or more switches may connect one or more outputs of the filter bank 320 to corresponding filter load circuits or to corresponding output ports of the multiplexer 210. For instance, as illustrated in FIG. 3, one output port of the filter bank 320 may be in communication with a switch 322A. The switch 322A may direct the output of the filter bank 322 either to a port 304B of the multiplexer 210 or to a filter load circuit 324A. Further, if a corresponding filter of the filter bank 320 is deactivated, the switch 322A may be placed in an open position. Another output port of the filter bank 320 may be in communication with a switch 322B. The switch 322B may direct the output of the filter bank 322 either to a port 304C or to one of the filter loads 324B and 324C. The selection of the filter load circuits 324B or 324C may be based on the operational communication bands. As previously mentioned, the load circuits, including the filter load circuits 324 and the bypass load circuits 314, may be selected to reduce insertion loss for the selected communication bands. Further, if a corresponding filter of the filter bank 320 is deactivated, the switch 322B may be placed in an open position.

As with the port 302, the ports 304A, 304B, and 304C (which may collectively be referred to as ports 304) can be both input ports and output ports. For example, if the wireless device 11 is receiving a signal, the ports 304 may serve as output ports that provide the signal, or portions of the signal associated with particular frequency bands, to the LNA receivers 250. On the other hand, if the wireless device 11 is transmitting a signal, the ports 304 may serve as input ports that receive one or more components of the signal associated with one or more frequency bands. The signal and/or CA signal may be output by the port 302 for transmission by the antenna.

Second Example Multiplexer

Figure 4A:
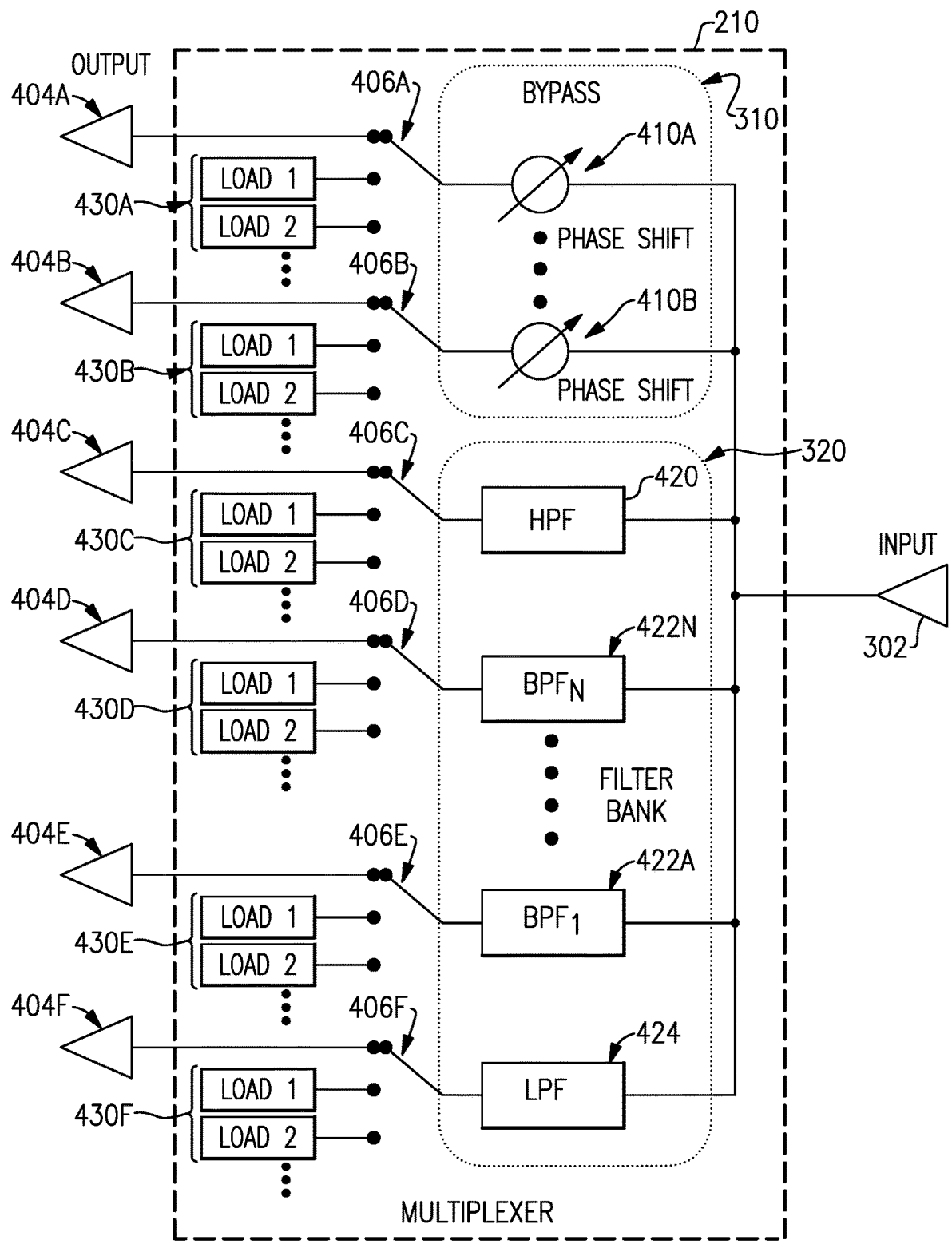
FIG. 4A illustrates a block diagram of another embodiment of the multiplexer of FIG. 2A or 2B.

FIG. 4A illustrates a block diagram of another embodiment of the multiplexer 210 of FIG. 2A. As with the multiplexer 210 of FIG. 3, the multiplexer 210 of FIG. 4A includes an input port 302 that directs a signal to the bypass circuit 310 and the filter bank 320.

The filter bank 320 includes a number of filter circuits. The filter circuits can include a high pass filter 420, a low pass filter 424, and a number of band pass filters 422A-422N (which are collectively referred to herein as "band pass filters 422"). The designation of high frequency bands that may be processed by the high pass filter 420, mid frequency bands that may be processed by the band pass filters 422, and low frequency bands that may be processed by the low pass filter 424 may vary based on applications or manufacturer specification, and this disclosure is not limited by a specific designation of what constitutes low, mid, or high frequency. In certain embodiments, the low frequency bands may include communication bands below 960 MHz, such as between 450 MHz and 960 MHz. Further, the mid frequency band may include frequencies between 1400 MHz and 2200 MHz. Moreover, the high frequency band may be between 2300 MHz and 6000 MHz. Although only one high pass filter 420 is illustrated and one low pass filter 424 is illustrated, the present disclosure is not limited as such. The filter bank 320 can include any number of high pass and/or low pass filters. Further, in some cases, the filter bank 320 may omit a high pass filter 420 or a low pass filter 424. Moreover, although a plurality of band pass filters 422 are illustrated, the filter bank may include zero, one, or any other number of band pass filters 422. Each band pass filter 422 may be configured to allow a different frequency or set of frequencies to be provided to a subsequent element while filtering out other frequencies.

The bypass circuit 310 may include one or more bypass circuits. In the illustrated example, two bypass circuits 410A and 410B are depicted. However, the bypass circuit 310 may include more or fewer bypass circuits. The bypass circuits 410A and 410B enable the use of CA with frequency bands that are not supported by traditional multiplexer designs. Further, a single bypass circuit may be active while any additional included bypass circuits may be deactivated (e.g., provided with an open load) to enable non-CA communication. A variety of implementations are possible for the bypass circuits 410A and 410B. For example, the bypass circuits 410A and 410B may be a phase shift network as illustrated in FIG. 4. As additional examples, the bypass circuits 410A and 410B may be transmission lines, lumped element LC phase shift networks, reflection-type phase shift networks, LC networks, and the like. In some embodiments, the bypass circuits 410A and 410B may provide direct connections between the input port 302 and the switches 406A and 406B, respectively. Further, in some cases, the bypass circuits 410A and 410B may be different types of circuits. For example, the bypass circuit 410A may be a transmission line and the bypass circuit 410B may be a phase shift network.

As with the example of FIG. 3, the output of bypass circuits 410A and 410B and the output of the high pass filter 420, the band pass filters 422, and the low pass filter 424 may be provided to a set of switches 406A-406F, respectively (which may collectively be referred to as switches 406). Each of the switches 406A-406F may switch between a respective output port 404A-404F (collectively referred to herein as output ports 404) and a respective set of load circuits 430A-430F (collectively referred to herein as load circuits 430). Further, in some cases, at least one of the switches 406 is capable of being configured in an open position such that neither the respective output port nor the associated load circuit is in electrical communication with the switch.

The set of load circuits 430 may each include one or more load circuits that are configured to provide a different terminal load to the bypass circuits 410A, 410B or the filter circuits 420, 422, or 424. For example, the bypass circuit 410A may be electrically connected to the output port 404A, Load1 of the set of load circuits 430A, or Load2 of the set of load circuits 430A. The bandpass processor 40 may determine whether to connect the bypass circuit 410A, via the switch 406A, to the output port 404A, Load1 of the load circuits 430A, or Load2 of the load circuits 430A based on frequency band or bands identified for communication by, for example, a base station. By including multiple load circuits in each set of load circuits 430, the insertion loss can be reduced by selecting the optimal load circuit from the available load circuits based on the frequency of a signal received by the multiplexer 210 in a single frequency band case or the frequencies received of signals used in a CA case. The optimal load circuit for different frequencies and/or use cases may be determined by simulation or load-pull measurement. In the case of a high band/low band (HB/LB) CA signal, the mid band (MB) or band pass filters and the bypass paths may be unused. By doing load-pull measurements of the unused ports and checking the insertion loss of the HB and LB filter paths, the optimal loads can be found for each path in the multiplexer. In some use cases, the optimal loads may be shorts or series circuits, such as 50 Ohm capacitors or inductors in series. Thus, the performance of the multiplexer 210 can be tuned based on the received signals. For example, in the case of a CA signal that includes a high frequency to be filtered by the high pass filter 420 and a low frequency to be filtered by the low pass filter 424, one or more of the bypass circuits 410A, 410B may be connected via the switches 406A, 406B, respectively, to load circuits selected to reduce or minimize the insertion loss along the signal paths associated with the high pass filter 420 and the low pass filter 424.

The load circuits 430 are configured to reduce the insertion loss in selected communication paths that are selected based on the desired communication frequency bands. For example, if a wireless device is configured to use CA combining both a high and a low frequency, the high pass filter 420 may be electrically connected to the output port 404C and the low pass filter 424 may be electrically connected to the output port 404F. Further, to reduce any insertion loss from the selected communication paths, one or more of the bypass circuits 410A and 410B may be electrically connected, respectively, to one of the load circuits from the set of load circuits 430A and 430B. In some cases, the filters and bypass paths are physically connected at one node. The isolation between two paths is typically not infinite. Therefore, the load circuit connected after the filter bank or the bypass circuits may cause mutual interference. Generally, this interference will cause the signal to deteriorate and cause insertion loss along a path within the multiplexer. However, the inclusion of a load circuit can help reduce the interference and the insertion loss.

Moreover, in some cases, the load circuits 430 can reduce the loading effect of one communication path in the multiplexer 210 on another communication path within the multiplexer 210. The multiplexer 210 can be tuned or reconfigured to reduce the loading effect by connecting one or more paths leading from the bypass circuits 310 and/or from the filter bank 320 to particular load circuits based on the frequency or frequencies of the signal or signals received by the multiplexer 210.

The load circuits may include LC circuits. In some cases, the one or more of the load circuits may be tunable providing additional flexibility to the multiplexer 210 and enabling a further reduction in both the loading effect and insertion loss. For example, the capacitors of the LC load circuits may be switched capacitors enabling the configuration of individual load circuits of the multiplexer 210. In some cases, the load circuits may include short or open circuits.

Figure 4B:
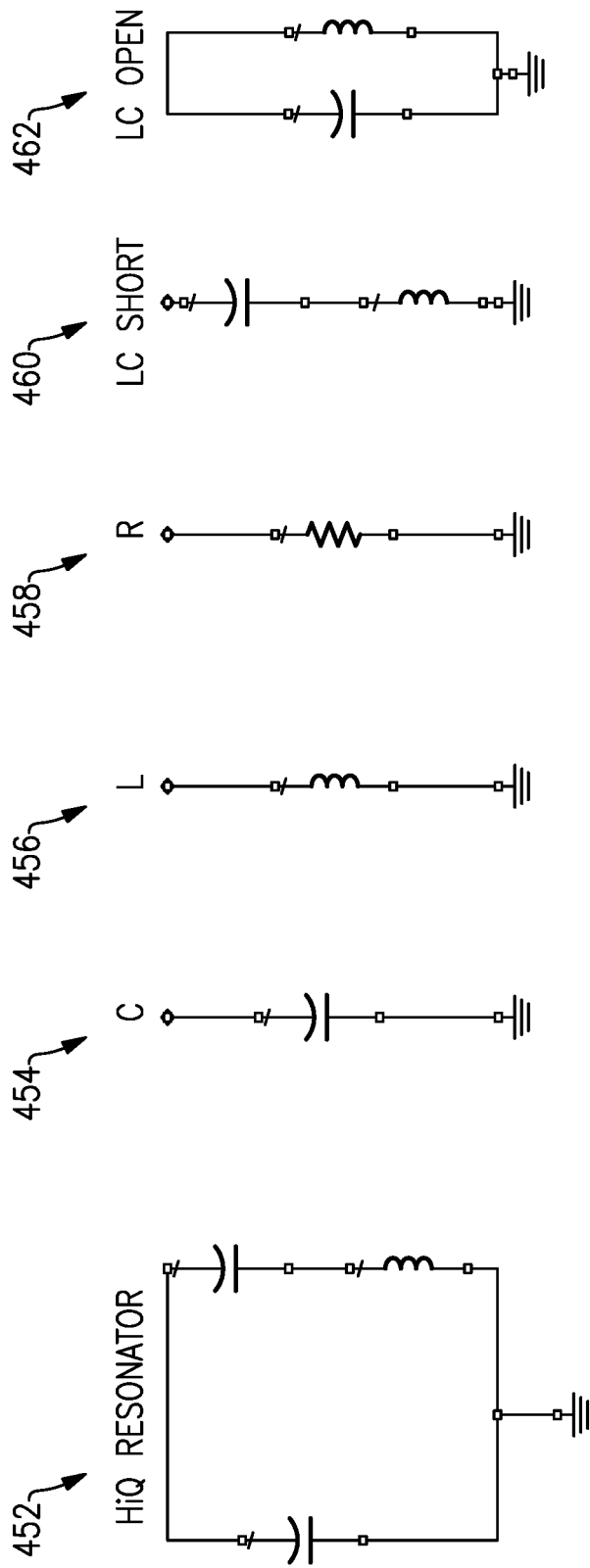
FIG. 4B illustrates example circuits that may be used as load circuits for the multiplexer of FIG. 4A.

FIG. 4B illustrates some example circuits that may be used as load circuits for the multiplexer 210 of FIG. 4A. As illustrated in FIG. 4B, at least some of the load circuits may include a high Q resonator 452 (e.g., a resonator with a relatively low rate of energy loss compared to the stored energy). Alternatively, or in addition, at least some of the load circuits may include a capacitor load circuit 454, which may include one or more capacitors in series, an inductor load circuit 456, which may include one or more inductors in series, or a resistor load circuit 458, which may include one or more resistors in series. Further, in some cases, at least some of the load circuits may include an LC short circuit 460, which may include a set of capacitors in series with a set of inductors. Moreover, at least some of the load circuits may include an LC open circuit 462, which may include a set of capacitors in parallel with a set of inductors. It should be understood that the load circuits of FIG. 4B are non-limiting examples of load circuits. Other types of load circuits may be used in certain embodiments of the present disclosure.

Returning to FIG. 4A, the output ports 404 may be connected to one or more antennas, such as the primary antennas 14 and/or the diversity antennas 22. In some cases, a plurality of output ports may be in electrical communication with the same antenna. In some implementations, the output ports 404 may connect to one or more elements between the multiplexer 210 and the antennas.

As previously described with respect to FIG. 3, the ports may be dual directional ports. Thus, the port 302 and the ports 404 may serve as both input ports and output ports based on whether the multiplexer is processing a receive signal or a transmit signal.

Example Dynamic Multiplexer Configuration Process

Figure 5:
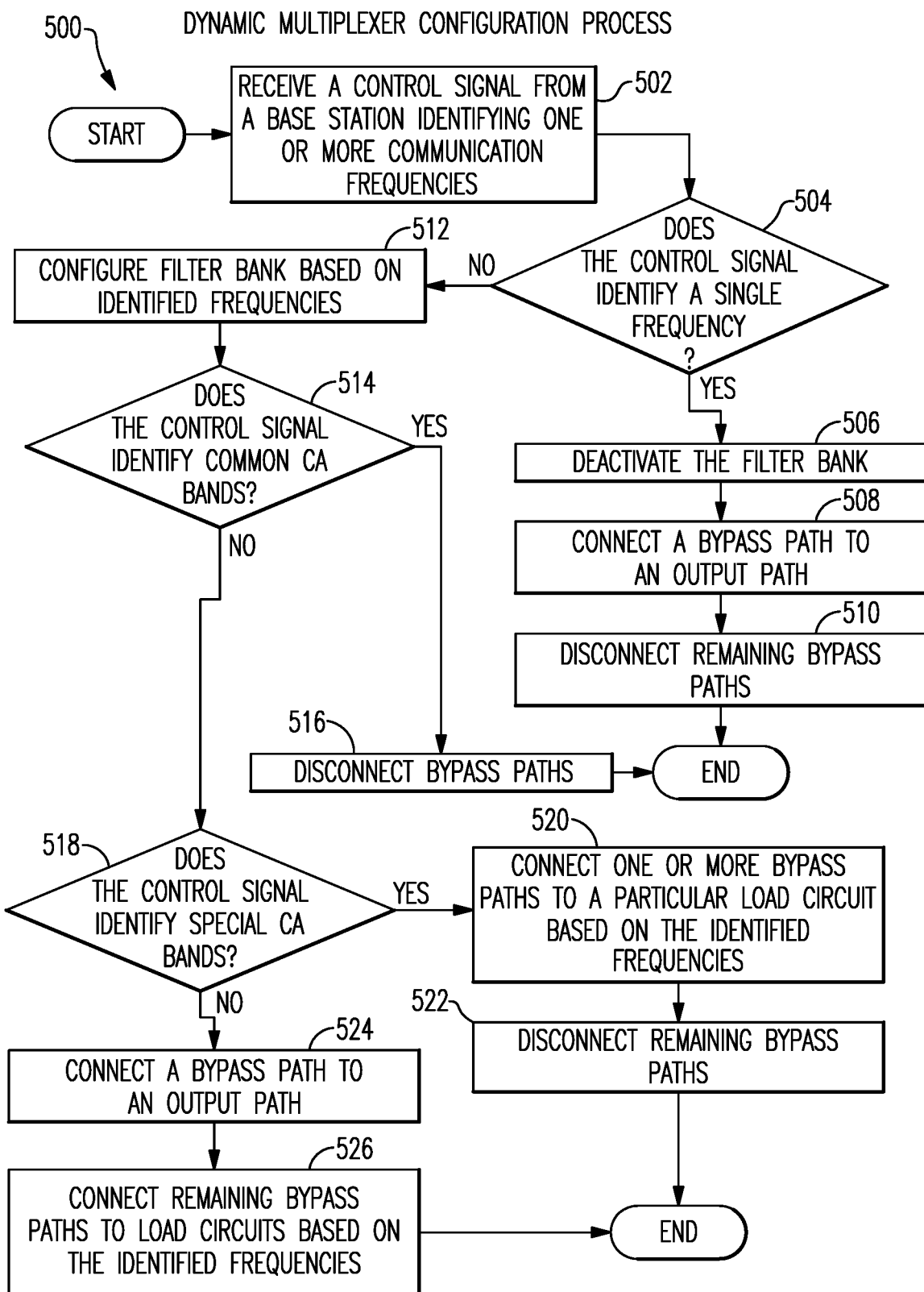
FIG. 5 presents a flowchart of an embodiment of a dynamic multiplexer configuration process.

FIG. 5 presents a flowchart of an embodiment of a dynamic multiplexer configuration process 500. The process 500 can be implemented by any system that can configure a multiplexer based, at least in part, on the frequency band or bands being used to communicate with another device, such as a base station. For example, the process 500 may be performed by a baseband processor 40, a call processor 212, a lookup table 216, a control 18, or a processor 20, to name a few. Although one or more systems may implement the process 500, in whole or in part, to simplify discussion, the process 500 will be described with respect to particular systems.

The process 500 begins at the block 502 where, for example, the baseband processor 40 receives a control signal from a base station identifying one or more communication frequencies. In some cases, the control signal is received by another element of a wireless device and is provided to the baseband processor 40. At decision block 504, the baseband processor 40 determines whether the control signal identifies a single frequency. In some cases, the baseband processor 40 determines whether the control signal identifies a single frequency band, which may be of a particular bandwidth.

If the control signal does identify a single frequency or frequency band, the wireless device 11 is communicating over a single frequency or frequency band in carrier aggregation is not being implemented or utilized. Thus, if it is determined at the decision block 504 that the control signal identifies a single frequency or frequency band, the baseband processor 40 deactivates the filter bank 320 at block 506. Deactivating the filter bank 320 may include ceasing to provide or not providing a voltage or power to the filter bank 320. Alternatively, or in addition, deactivating the filter bank 320 may include opening the switches 406C-406F. In some cases, deactivating the filter bank 320 may include connecting each of the filters of the filter bank 322 ground.

At block 508, the baseband processor 40 connects a bypass path (e.g., the bypass path associated with the bypass circuit for today) to an output path, which is in electrical communication with the output port 404A. Further, the baseband processor 40 disconnects the remaining bypass paths at block 510. Thus, with reference to the example of FIG. 4, the bypass path associated with the bypass circuit 410B is disconnected. Disconnecting the bypass path associated with the bypass circuit 410B may include deactivating the bypass circuit 410B by, for example, ceasing to provide or not providing a voltage or power to the bypass circuit 410B. Further, disconnecting the bypass path associated with the bypass circuit 410B may include opening the switch 406B. In some cases, disconnecting the bypass path may include connecting the bypass circuit 410B to ground.

It is determined at the decision block 504 that the control signal identifies multiple frequencies were multiple frequency bands, the wireless device 11 is communicating using carrier aggregation. At block 512, the baseband processor 40 configures the filter bank 320 based on the identified frequencies. Configuring the filter bank 320 may include accessing a lookup table 216 to determine the switch configurations for the switches 406C-406F based on the identified frequencies.

At the decision block 514, the baseband processor 40 determines whether the control signal identifies common CA bands. These common CA bands include frequency bands that are typically used in carrier aggregation communication. Often, the combination of frequency bands will be a combination of a low-band with a mid-band, a mid-band with a high-band, or a low-band with a mid-band with a high-band. However, other combinations may be possible. In some cases, the common CA bands may include a combination of two or more of the following frequency bands: Band 3 (1710-1880 MHz); Band 7 (2550-2690 MHz); Band 49 (1880-1920 MHz); Band 41 (2496-2690 MHz); and Band 5 (824-894 MHz). Typically, the common CA bands include frequency bands with larger spacing, such as 150 MHz or more. In some cases, the common CA bands may have spacing of 300 MHz or more. Bands that are directly adjacent or that have overlapping frequency are typically not defined as CA combinations. Further, the common CA bands may have an isolation requirement of approximately 20 dB or more. The filter bank may be optimized to process the common CA band frequencies, and thus, usually, it is unnecessary for unused paths to be terminated with a particular load circuit. Generally, the common CA bands are communication bands that have been identified for carrier aggregation by one or more wireless communications standard-setting bodies or entities. Further, the common CA bands are typically separated by enough frequencies that a special filter is not required and a filter with low insertion loss can be used. If it is determined that the control signal identifies common CA frequency bands, the baseband processor 40 disconnects the bypass paths at the block 516. Disconnecting the bypass paths can include one or more of the embodiments described with respect to the block 510.

If it is determined at the decision block 514 that the control signal identifies one or more frequency bands that are not typically used in carrier aggregation, the baseband processor 40 determines at the decision block 518 whether the control signal identifies one or more special carrier aggregation frequency bands. The special CA bands may be distinguished from the common CA bands based on how frequently the special CA bands are used compared to the common CA bands. The special CA bands may be used less frequently because of the expense, and size of the filters and multiplexers to support the frequency bands. Further, such filters and multiplexers may be less efficient due to insertion loss. Moreover, designing the filters and multiplexers can be challenging. However, the embodiments disclosed provide a reconfigurable multiplexer that enables support for special CA bands that are unsupported by traditional multiplexers or are supported more efficiently compared to traditional multiplexers.

The special CA bands can include frequencies that are not typically used in carrier aggregation because, for example, the spacing between the bands is relatively narrow. For example, the spacing between the bands may be 150 Mhz, 100, MHz, or less. For example, the special CA bands may include a CA signal that combines Band 4 and Band 30, which has a spacing of approximately 150 MHz. In certain embodiments, although the spacing for the special CA bands may vary, it will be less than the spacing for the common CA bands. Typically, the filter bank is not optimized to handle these bands together and thus, the inclusion of application specific load terminations or load circuits for the unused paths can be used to enable the multiplexer to process the special CA bands. Further the special CA bands may include frequencies that are often found within the dead zones or zones not supported by traditional multiplexers. In some cases, the special CA bands include frequencies that can be challenging to filter and often require filters with higher tolerances because, for example, the frequencies are relatively close together and consequently may require a sharp filter to separate. Including these higher tolerance filters can result in larger and more expensive multiplexers. Advantageously, in certain embodiments, the inclusion of the bypass circuit 310 enables the multiplexer 310 to support the special CA bands. Further, in certain embodiments, the bypass circuit 310 enables the multiplexer 310 to support the special CA bands without increasing the size or complexity of the filter bank 320.

If it is determined at the decision block 518 that the control signal identifies one or more special CA frequency bands, the baseband processor 40 connects one or more bypass paths to a particular load circuit (e.g., Load1 from the set of load circuits 430A) based on the identified frequencies at block 520. In some cases, the baseband processor 40 may access a lookup table 216 to determine the particular loads to terminate the bypass circuits 410A and/or 410B with based on the identified frequencies. For instance, the baseband processor 40 may determine that the bypass circuit 410B is to be electrically connected with Load2 of the load circuits 430B based on the identified frequencies. By connecting the bypass circuit 410B to the Load2, a loading effect on communication paths leading from the filter bank 320 may be reduced enabling filters of the filter bank 322 provide improved filtering or filtering with a sharper shape compared to multiplexers that do not include the bypass circuit 310. At block 522, the baseband processor 40 disconnects remaining bypass paths. The block 522 can include one or more of the embodiments described with respect to the block 510. In some cases, the block 522 may be optional or omitted. For example, in some cases each of the bypass circuits 310 may be configured to electrically connect to a load circuit. Thus, in such cases, none of the bypass paths may be disconnected.

If it is determined at the decision block 518 that the control signal does not identify special CA frequency bands, it is determined that the identified frequencies are unlicensed frequency bands or license assisted access frequency bands (e.g., LTE-U or LTE-LAA bands). These frequencies are typically between 3.4 and 6 GHz. In some embodiments, the baseband processor 40 confirms whether the identified frequencies are LTE-U or LTE-LAA frequencies. If it is determined that the identified frequencies are not LTE-U or LTE-LAA frequencies, the wireless device 11 may output a signal to, for example, a base station indicating that identified frequencies are unsupported.

If it is determined that the identified frequencies are LTE-U or LTE-LAA frequencies, the baseband processor 40 connects a bypass path to an output path or an output port at block 524. For example, the baseband processor 40 may configure the switch 406A to connect the bypass circuit 410A to the output port 404A. At block 526, the baseband processor 40 connects the remaining bypass paths to load circuits selected based on the identified frequencies. In certain embodiments, the bypass paths have lower insertion loss compared to paths that include a filter from the filter bank 320. Thus, by turning on or connecting a bypass path to an output port at the block 524, a wider frequency spacing can be supported compared to multiplexers that do not incorporate the bypass circuits 310. Advantageously, in certain embodiments, the ability to support the wider frequency spacing enables the support of LTE-U or LTE-LAA bands that are not supported by some other multiplexers.

Second Example Dynamic Multiplexer Configuration Process

Figure 6:
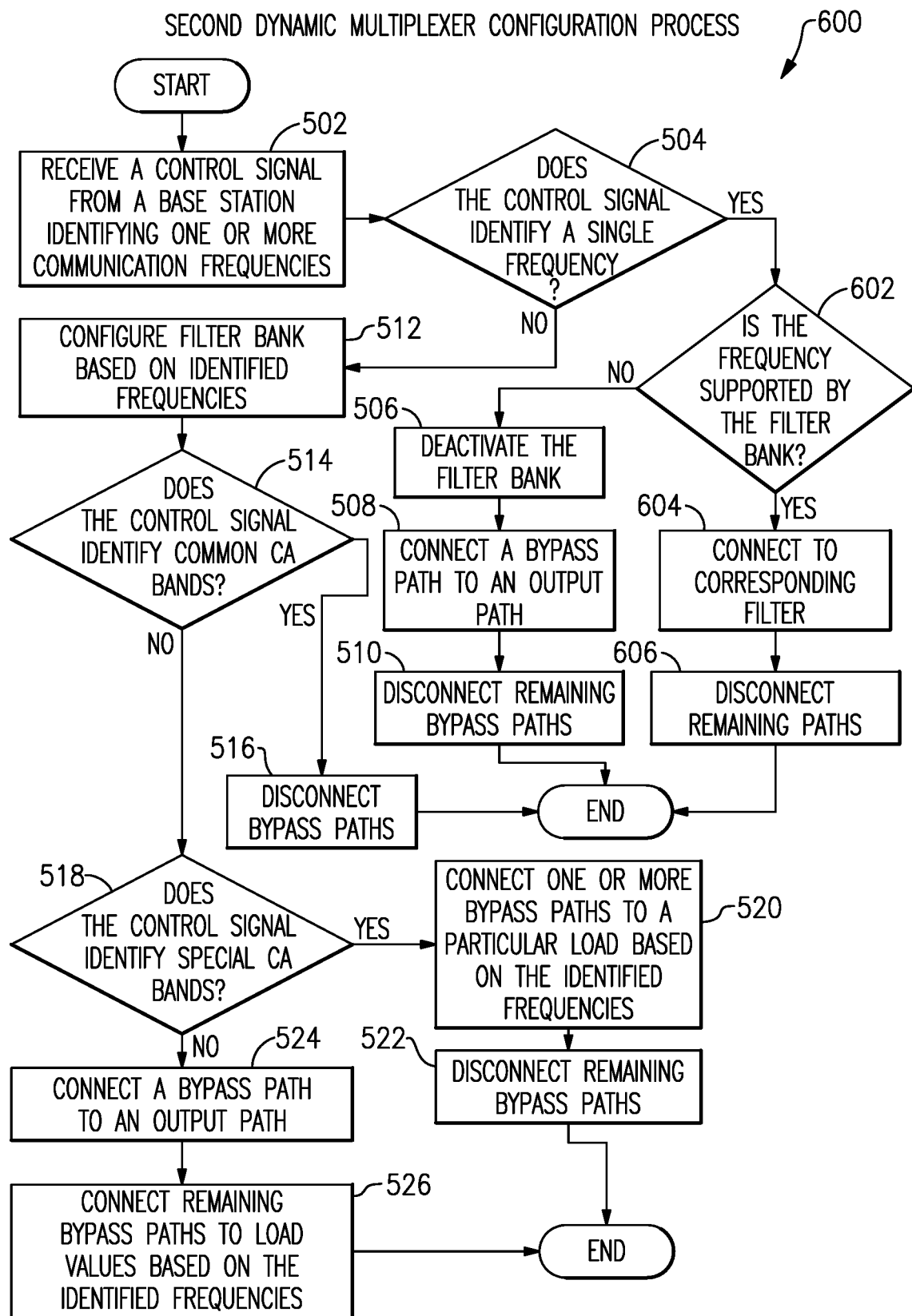
FIG. 6 presents a flowchart of an embodiment of a second dynamic multiplexer configuration process.

FIG. 6 presents a flowchart of an embodiment of a second dynamic multiplexer configuration process 600. As with the process 500, the process 600 can be implemented by any system that can configure a multiplexer based, at least in part, on the frequency band or bands being used to communicate with another device, such as a base station. For example, the process 600 may be performed by a baseband processor 40, a call processor 212, a lookup table 216, a control 18, or a processor 20, to name a few. Although one or more systems may implement the process 600, in whole or in part, to simplify discussion, the process 600 will be described with respect to particular systems. Further, a number of the operations that may be performed as part of the process 600 are similar to the operations that may be performed as part of the process 500 and share the same reference numerals. Thus, to simplify discussion, descriptions of blocks of FIG. 6 that share the same reference numerals with blocks of FIG. 5 are not repeated below.

As with the process 500, the process 600 begins with embodiments of the operations of block 502, which may then proceed to the operations of decision block 504. Further, if it is determined at the decision block 504 that the control signal identifies a plurality of frequencies, the process 600 proceeds to the block 512 where the process 600 continues to proceed similarly to the process 500 described with respect to FIG. 5.

However, if it is determined at the decision block 504 that the control signal identifies a single frequency, or single frequency band, the baseband processor 40 determines whether the frequency is supported by the filter bank 320 at decision block 602. Determining whether the frequency is supported by the filter bank 320 may include determining whether the filter bank 320 includes a filter designed to pass the frequency while filtering out or removing other frequencies and/or undesired harmonics of the frequency. For instance, if the frequency is 2620 MHz, which is the central frequency of Band 7, the baseband processor 40 may determine whether the filter bank 320 includes a filter configured to pass Band 7 signals while rejecting non-Band 7 signals. This determination may be made by accessing a table of supported frequency bands from, for example, the lookup table 216.

If it is determined at the block 602 that the frequency is not supported by the filter bank 320, the process 600 proceeds to the block 506 where the filter bank is deactivated. The remainder of the process 600 subsequent to the block 506 is similar to the process 500 and the discussion is not repeated.

On the other hand, if it is determined at the block 602 that the frequency is supported by the filter bank 320, the process 600 proceeds to the block 604. At the block 604, the baseband processor 40 provides one or more control signals to the multiplexer 210 that cause the filter of the filter bank 320 that corresponds to the frequency to be placed in electrical connection with the corresponding output port. In other words, in certain embodiments, the filter bank 320 is configured to enable the signal to pass through the filter corresponding to the frequency band of the signal. At block 606, the remaining paths within the multiplexer 210 are disconnected. Thus, the switches corresponding to the non-selected filters may be opened. Further, the switches corresponding to the bypass paths are opened. Advantageously, in certain embodiments, by connecting the single frequency or signal frequency band to a filter path, spurious signals, noise, and undesired harmonics may be removed from the signal. However, in cases where the filter bank 320 does not include a corresponding filter, bypass circuits can enable the multiplexer 210 to support communication of the signal. In embodiments where it is desired to prevent communication via a particular frequency, the multiplexer 210 can be configured to open the switches and/or connect the switches to terminal loads in the multiplexer 210 to prevent the signal from being passes to the antenna and/or to the receiver LNAs.

Triplexers

In certain embodiments, the multiplexer 210 of the front-end module 202 can be replaced with a triplexer. Advantageously, in certain embodiments, the design of a triplexer can be easier than certain multiplexer designs, thereby resulting in reduced resource usage and less strict tolerances compared to certain multiplexer designs. For example, as will be discussed in more detail with respect to FIGS. 7A-7E, a triplexer can be designed with cascading diplexers that eliminate the need for a bandpass filter. In certain cases, a band pass filter may be more difficult to design compared to a low pass filter or a high pass filter because, for example, the band pass filter is configured to prevent frequencies both below a first threshold and frequencies above a second threshold. In contrast, a low pass filter is configured to prevent frequencies above a single threshold and similarly, the high pass filter is configured to prevent frequencies below a single threshold.

As band pass filters can be more challenging to design compared to low pass and/or high pass filters, by eliminating the need for a band pass filter, the triplexer can be simplified compared to certain multiplexer designs resulting in the expenditure of less resources compared to that utilized in certain multiplexer designs. Consequently, in certain embodiments, triplexers may be easier and cheaper to produce than certain multiplexers because, for example, the triplexers may require less strict tolerances than certain multiplexers. Further, in certain embodiments, the triplexer may have a smaller footprint due, for example, to the lower tolerances required by the filters of the triplexer compared to that of certain multiplexers that may include a number of band pass filters. For example, the filters of the triplexer may be designed with fewer capacitors and/or smaller inductors compared to a multiplexer that may include a band pass filter.

Example Triplexer Design

Figure 7A:
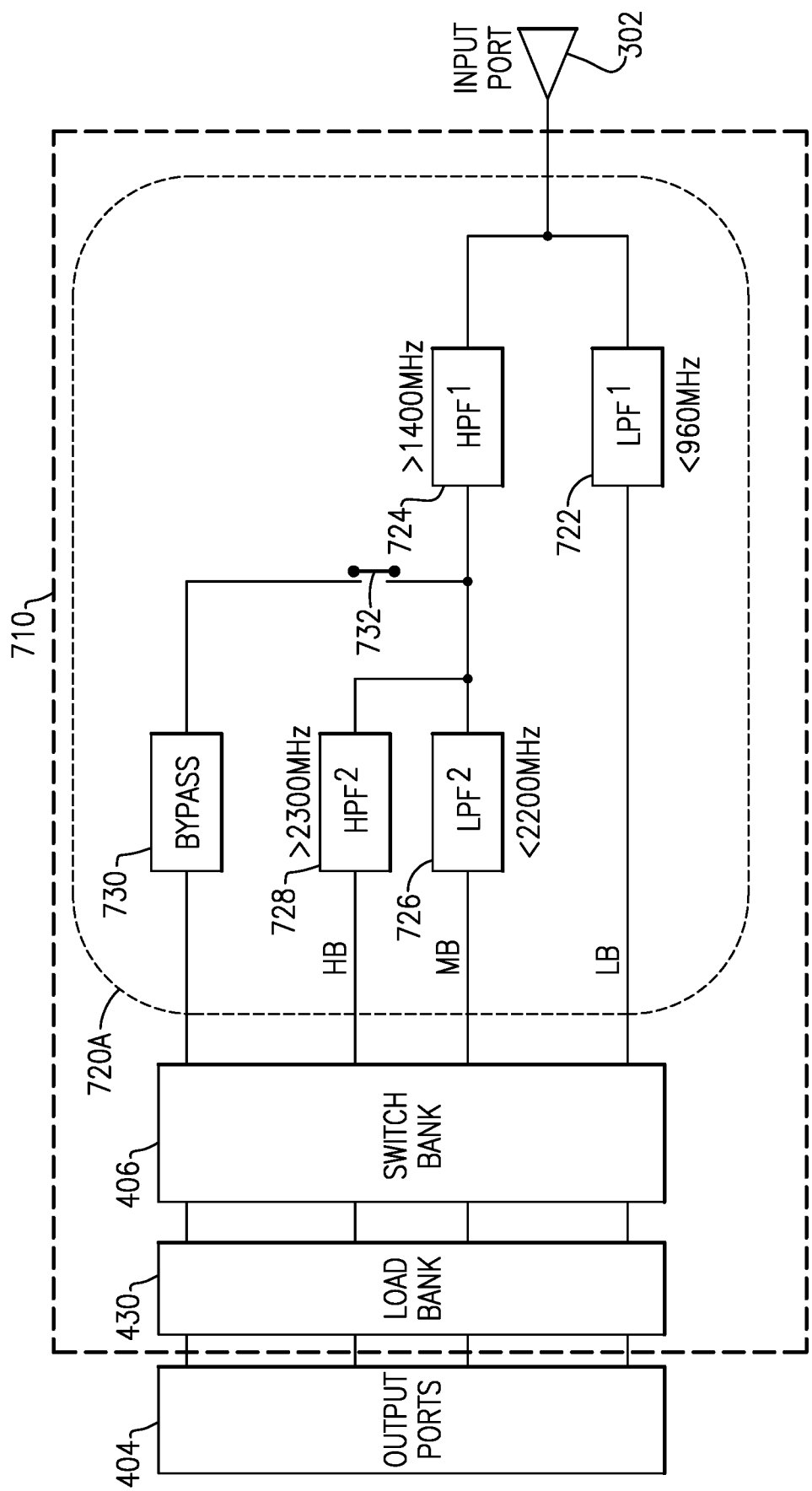
FIG. 7A illustrates a block diagram of an embodiment of a triplexer that may serve as an alternative to the multiplexer of FIG. 2A and FIG. 2B.

FIG. 7A illustrates a block diagram of an embodiment of a triplexer 710 that may serve as an alternative to the multiplexer 210 of FIG. 2A and FIG. 2B, and as further illustrated in FIG. 3 and FIG. 4. The triplexer 710 may receive an input signal via the input port 302. This input signal may be a CA signal comprising multiple frequency bands. Further, this input signal may be provided to a filter bank 720A, which can split the CA signal into its constituent frequency bands. The output of the filter bank 720A may be provided to a switch bank 406, which may in turn provide the one or more signals to a set of one or more loads, or a load bank 430. Alternatively, or in addition, the one or more signals may be provided to a set of one or more output ports 404. The input port 302, the switch bank 406, the load bank 430, and the output ports 404 may include one or more of the embodiments previously described with respect to the multiplexer 210.

The filter bank 720A may include a number of diplexers arranged in a cascade design, which may also be referred to as a daisy chain. In other words, in certain embodiments, a set of one or more filters within the filter bank 720A may be connected in series with another set of one or more filters in the filter bank 720A. In the example of FIG. 7A, the filters of the filter bank 720A are arranged in two tiers, levels, or stages. Although FIG. 7A only illustrates two tiers of filters, the present disclosure is not limited as such and any number of tiers or sets of filters may be connected in a cascade design as part of the filter bank 720A.

The first tier or stage of filters in the illustrated example of FIG. 7A includes a low pass filter 722 and a high pass filter 724. These filters, and the other illustrated filters of the filer bank 720A, may be diplexers. However, the present disclosure is not limited as such, and it should be understood that other types of circuits may be used to implement the filters of the filter bank 720A.

In one non-limiting example, the low frequency band ("LB") may include frequencies below 960 MHz and the mid ("MB") and/or high frequency band ("HB") may include frequencies above 1400 MHz. Thus, the low pass filter 722 may pass frequencies below 960 MHz and block frequencies at or above 960 MHz and the high pass filter 724 may pass frequencies above 1400 MHz and block frequencies below or at 1400 MHZ. In this non-limiting example, frequencies between 960 MHz and 1400 MHz may be blocked, filtered, or not processed by the triplexer 720A. However, it should be understood that, in certain implementations, different filters may be used to accommodate different frequency bands. For example, in a satellite television receiver, the filters may be configured to pass frequencies between 950 MHz and 1450 MHz.

The second tier or stage of filters in the illustrated example of FIG. 7A includes a second low pass filter 726 and a second high pass filter 728. As stated above, these filters may be, but are not limited to, diplexers. In one non-limiting example, the mid frequency band may include frequencies between 1400 MHz and 2200 MHz, and the high frequency band may include frequencies above 2300 MHz. Thus, the low pass filter 726 may pass frequencies below 2200 MHz and block frequencies at or above 2200 MHz. As frequencies below 1400 MHz are blocked by the high pass filter 724, the resultant signal output by the low pass filter 726 will be between 1400 and 2200 MHZ.

The high pass filter 728 may pass frequencies above 2300 MHz and block frequencies below or at 2300 MHZ. In this non-limiting example, frequencies between 2200 MHz and 2300 MHz may be blocked, filtered, or not processed by the triplexer 720A. However, it should be understood that, in certain implementations, different filters may be used to accommodate different frequency bands.

In addition to the above-described filters, the filter bank 720A may include a bypass circuit 730. In certain embodiments, the bypass circuit 730 may include one or more of the embodiments previously described with respect to the set of bypass circuits 310 and/or the circuits 410A, 410B that may be included as part of the bypass circuit 310. Further, the filter bank 720A may include a switch 732 that may be used to electrically connect or disconnect the bypass circuit 730 from the node between the high pass filter 724 and the second tier or stage of filters. In certain embodiments, the switch 732 may be a transistor. In certain embodiments, the switch 732 is optional and may, in some implementations, be omitted. In some cases, the omission of the switch 732 may result in higher insertion loss when operating in the bypass mode.

During operation, the switch 732 may be opened when a MB/HB CA signal is received by the wireless device that includes the triplexer 710. The operation of the switch may be controlled by, for example, the baseband processor 40 or the call processor 212 in response to a control signal received from a base station. Further, in some cases, the bypass circuit 730 may be deactivated by, for example, disconnecting a power supply from the bypass circuit 730.

When the wireless device that includes the triplexer 710 is operating in a non-CA mode, the switch 732 may be closed enabling signal frequencies above 1400 MHz to be provided to the bypass circuit 730 instead of the filters 726, 728. As a result, the triplexer 710 may have lower loss compared to designs that do not include the bypass circuit 730.

In certain embodiments, the bypass circuits 310 and/or 730 may include a non-linear device. In some cases, it is not desirable to connect the non-linear device directly to the antenna. For example, suppose that a CA signal aggregates a band 3 and a band 8 signal. In such a case, the second harmonic of the band 8 signal could pass through the band 3 path affecting the processing of the band 3 signal. In such an example, it would be desirable to use a low pass filter to reduce the interference of the band 8 second harmonic on the band 3 signal. Further, continuing the previous example, a low pass filter may be used in the band 3 path to reject the fundamental signal of band 8. The low pass filter may be desired because the band 8 fundamental signal may generate unacceptable harmonics at a non-linear device in the band 3 signal path. Advantageously, by using a cascade design, the high pass filter 724 may be included in the signal path of the bypass circuit 730 preventing the high level signal components of a low band signal from generating harmonics on a non-linear device, such as switch 732.

Additional Example Triplexer Designs

FIGS. 7B-7E present a number of alternative triplexer designs. Each of the triplexer designs may include some or all of the embodiments previously described with respect to FIG. 7A. Further, reference number from FIG. 7A are re-used to indicate correspondence between referenced elements.

Figure 7B:
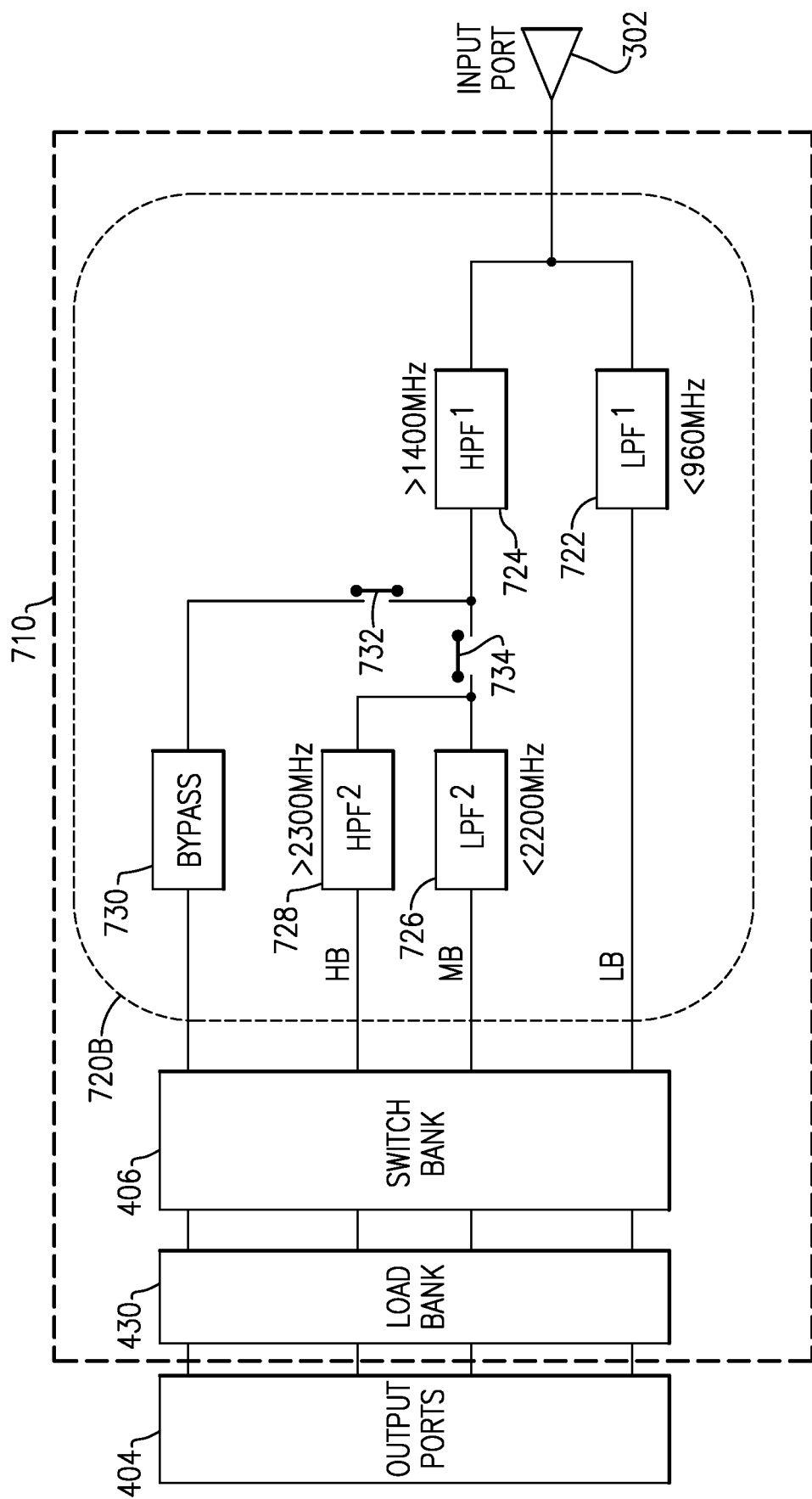
FIG. 7B illustrates a block diagram of a second embodiment of the triplexer of FIG. 7A.

FIG. 7B illustrates a block diagram of a second embodiment of the triplexer 710 of FIG. 7A. The triplexer 710 of FIG. 7B includes a filter bank 720B that is a modified version of the filter bank 720A. The filter bank 720B includes an additional switch 734 located between the high pass filter 724 of the first filter stage and the second filter stage. The switch 734 enables the second filter stage to be disconnected when the filter bank 720B is operating in a bypass mode. Advantageously, in certain embodiments, by including the switch 734, improved isolation can be achieved and the loading effect on the bypass path can be reduced.

Figure 7C:
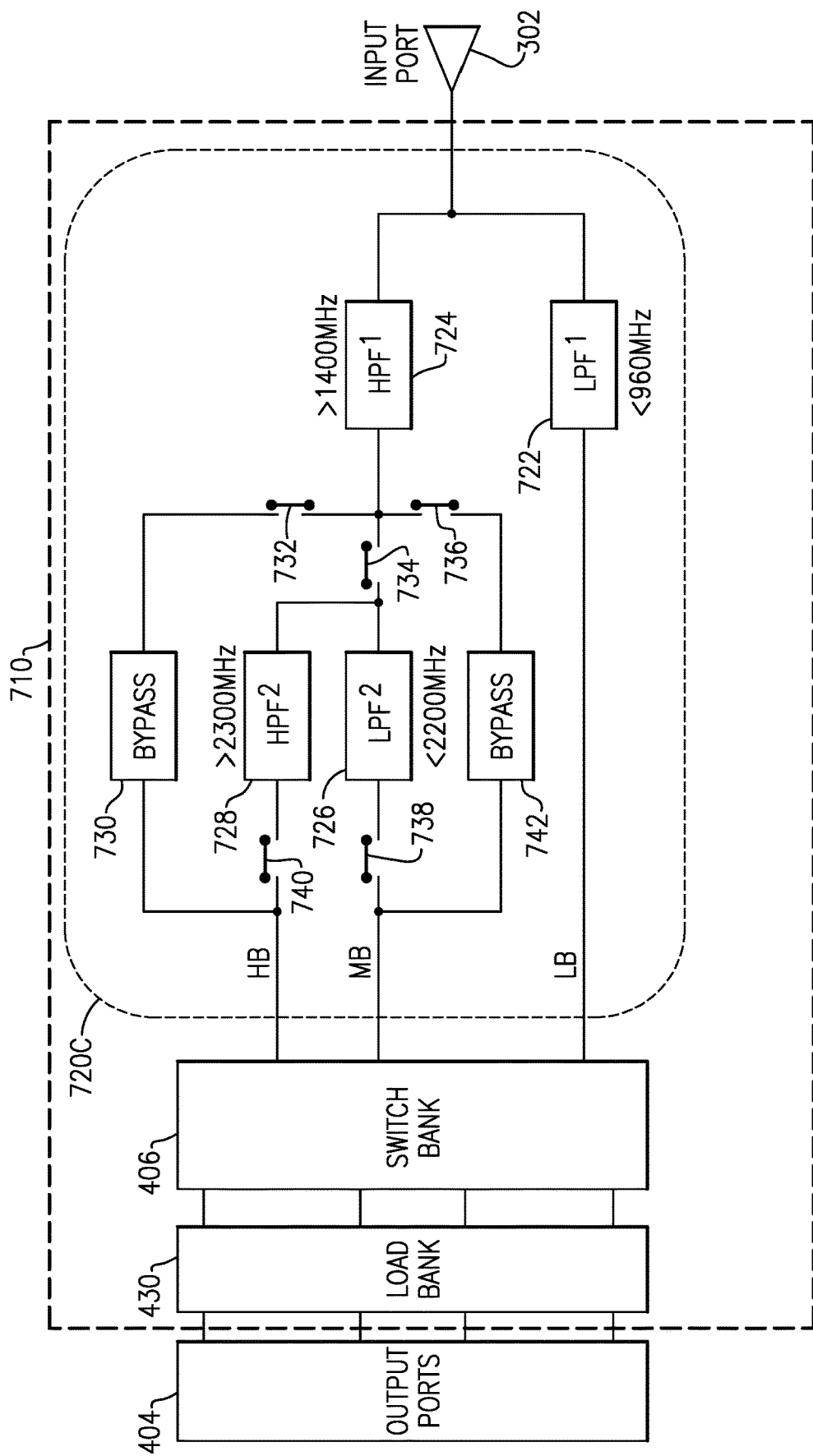
FIG. 7C illustrates a block diagram of a third embodiment of the triplexer of FIG. 7A.

FIG. 7C illustrates a block diagram of a third embodiment of the triplexer 710 of FIG. 7A. The triplexer 710 of FIG. 7C includes a filter bank 720C that is a modified version of the filter bank 720A. The filter bank 720C separates the bypass circuit into two separate bypass circuits 730 and 742. The bypass circuit 730 can be optimized for use with the high band frequency and the bypass circuit 742 can be optimized for use with the mid band frequency. Further, the filter bank 720C can include switches 738 and 740 positioned after the low pass filter 726 and the high pass filter 728, respectively, in the high band and mid band signal paths. Advantageously, in certain embodiments, isolation can be improved and the loading effect reduced by the addition of the additional switches in the mid band and high band signal paths. Further, although in some cases, the filter bank 720C may be more complex compared to some of the other embodiments disclosed herein, the filter bank 720C is easier to optimize for various use cases because, for example, of the separate bypass circuits and improved isolation capabilities of the filter bank 720C.

When operating in the MB/HB CA case, the bypass circuits 730 and 742 may be disabled. Further, the switches 732 and 736 may be opened and the MB/HB CA signal may be processed by the second stage filters 726 and 728. However, when operating in a non-CA case, or when the CA is one of the HB or MB in combination with the LB, the MB or HB signal may be processed by the respective bypass circuit 742 or 730. For example, in the CA case that combines a MB and LB signal, the MB signal may be provided to the bypass 742 with the switches 734, 738 and 732 open and the switch 736 closed. As another example, in the CA case that combines a HB and LB signal, the HB signal may be provided to the bypass 730 with the switches 728, 734 and 736 open and the switch 732 closed.

Figure 7D:
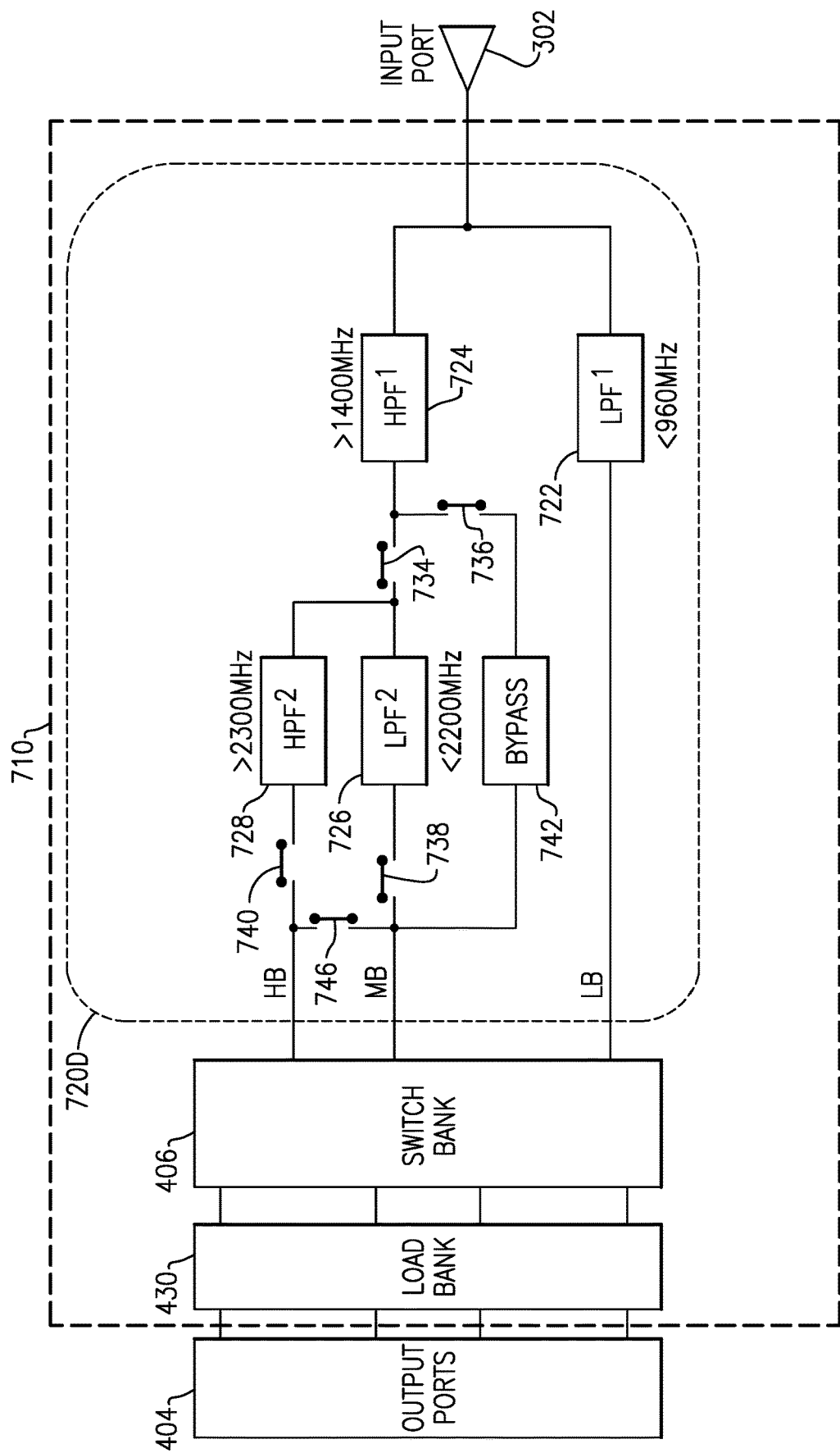
FIG. 7D illustrates a block diagram of a fourth embodiment of the triplexer of FIG. 7A.

FIG. 7D illustrates a block diagram of a fourth embodiment of the triplexer 710 of FIG. 7A. The triplexer 710 of FIG. 7D includes a filter bank 720D that is a modified version of the filter bank 720A. The filter bank 720D is a variant of the filter bank 720C that includes a single bypass circuit 742 that may be used for either mid band or high band frequencies. The filter bank includes a switch 746 that can be used to let HB and MB share one bypass in non-CA mode or any MB/LB, HB/LB CA mode.

Figure 7E:
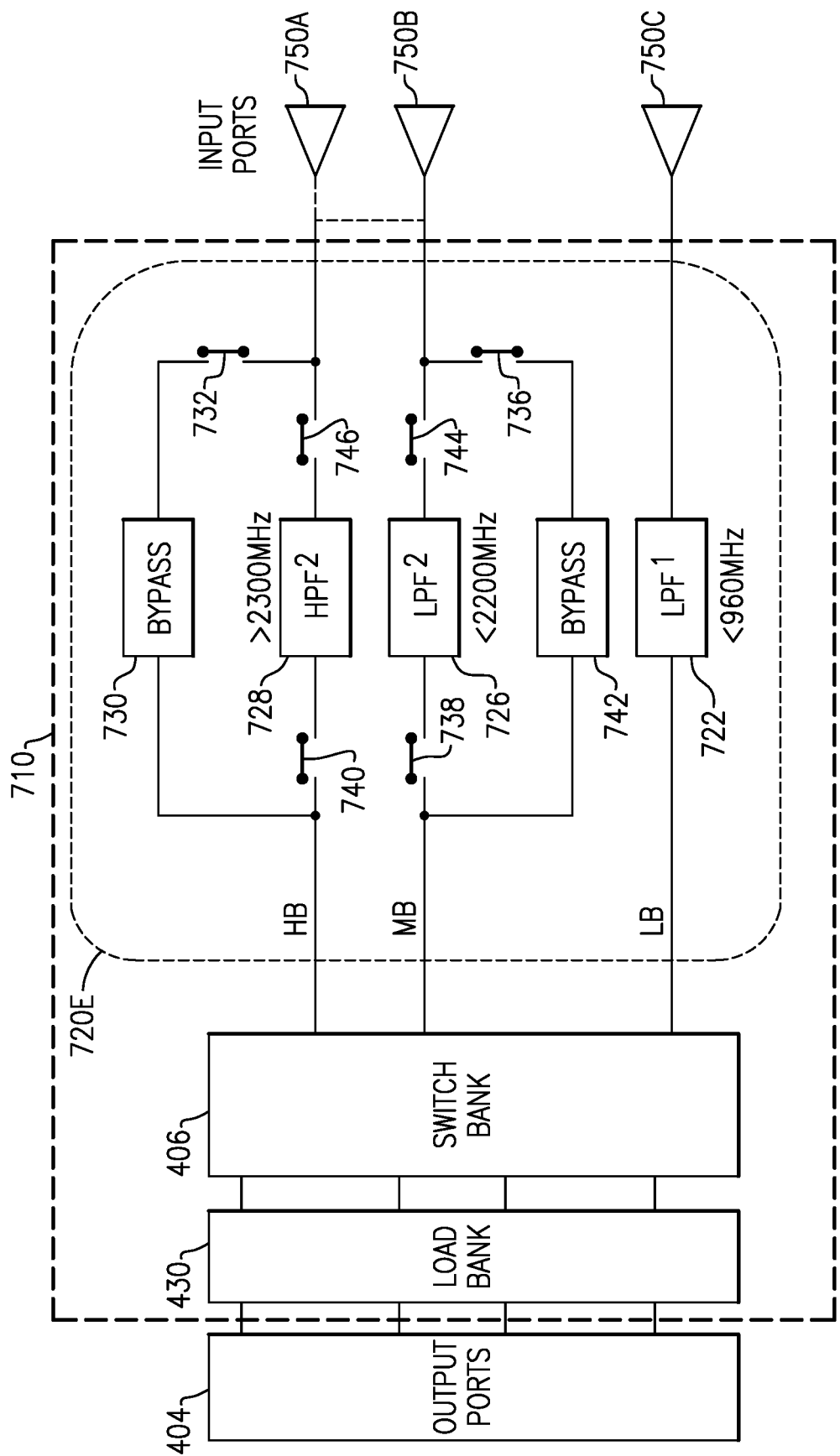
FIG. 7E illustrates a block diagram of a fifth embodiment of the triplexer of FIG. 7A.

FIG. 7E illustrates a block diagram of a fifth embodiment of the triplexer 710 of FIG. 7A. The triplexer 710 of FIG. 7E includes a single stage filter bank 720E. Further, the triplexer 710 includes a plurality of input ports 750A, 750B, and 750C. Although three input ports are illustrated, in certain embodiments, the filter bank 720E may be modified to receive any other number of inputs. For example, the triplexer 710 of FIG. 7E could have two or four input ports. Advantageously, in certain embodiments, the use of separate input ports can reduce the loading effect and improve isolation of the signal paths. Further, the number of filters may be reduced. For example, the filter bank 720E eliminates one high pass filter compared to the filter bank 720A. Further, the HB signal path associated with the input port 750A can be associated with the bypass circuit 730, which can be optimized for the high frequency signal (e.g., signals above 2300 MHZ). Similarly the MB signal path associated with the input port 750B can be associated with the bypass circuit 742, which can be optimized for the mid band frequency signal (e.g., signals between 960 and 2200 MHZ). It should be understood that the frequency of the low band, the mid band, and the high band signals may be application specific and may vary for different implementations. Thus, for example, in one non-limiting alternative example, the high band frequency may be frequencies above 5000 MHz and the mid band frequency may be between 2500 and 5000 MHZ and the low band frequency may be below 2500 MHZ.

Moreover, the signal paths can include a number of switches to improve isolation. For example, when using the bypass circuit 730, the switches 740 and 746 can be opened and the switch 732 can be closed. Similarly, when using the bypass circuit 744, the switches 738 and 744 can be opened and the switch 736 can be closed. When the bypass circuits are not being used, the switch leading to the respective bypass circuit (e.g., switch 732 or switch 736) can be opened and the switches for the corresponding filter (e.g., the switches 740 and 746, or the switches 744 and 738) can be closed.

Example Dynamic Multi-Stage Multiplexer Configuration Process

Figure 8:
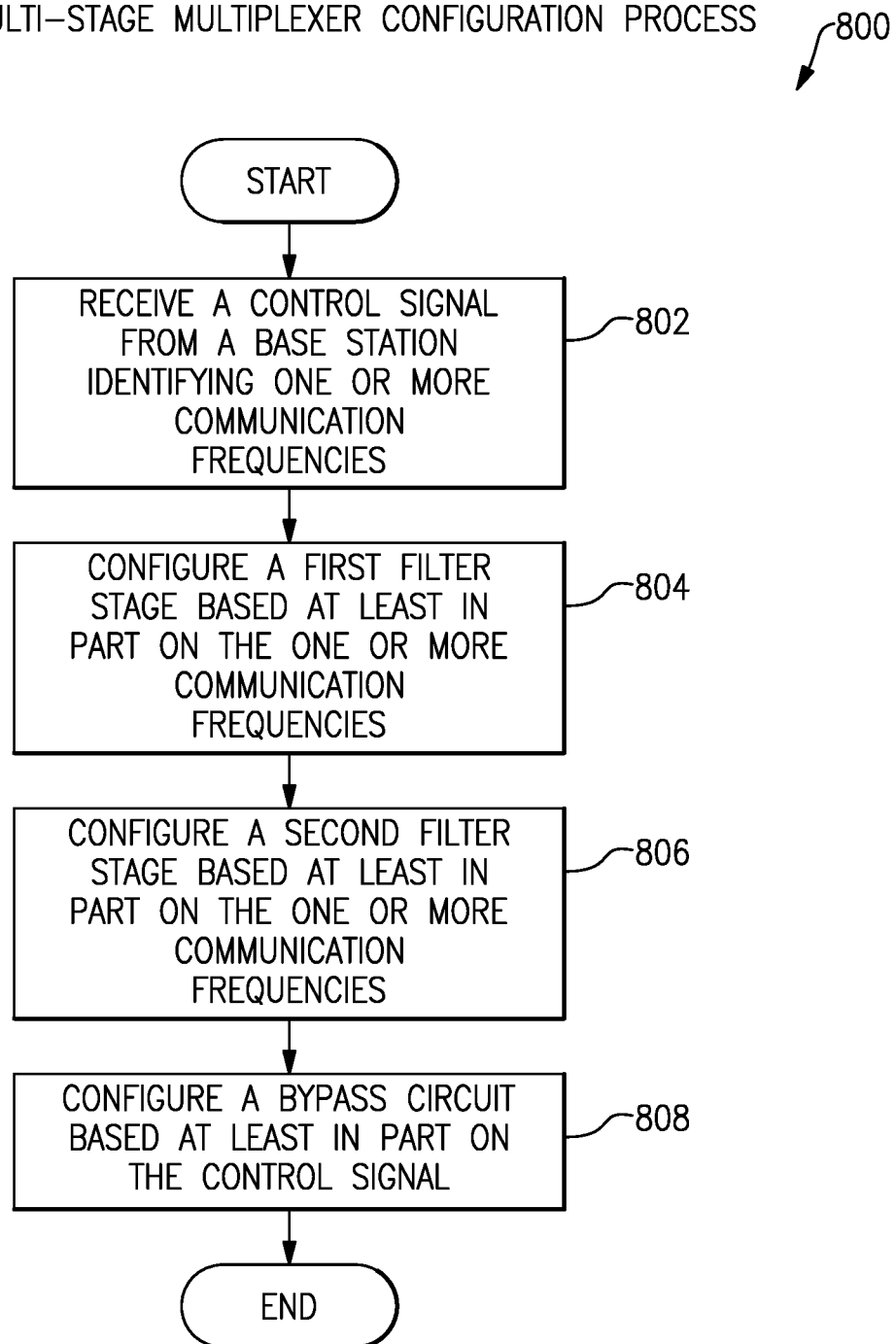
FIG. 8 presents a flowchart of an embodiment of a dynamic multi-stage multiplexer configuration process.

FIG. 8 presents a flowchart of an embodiment of a dynamic multi-stage multiplexer configuration process 800. As with the processes 500 and 600, the process 800 can be implemented by any system that can configure a multi-stage multiplexer (such as the triplexer 710) based, at least in part, on the frequency band or bands being used to communicate with another device, such as a base station. For example, the process 800 may be performed by a baseband processor 40, a call processor 212, a lookup table 216, a control 18, or a processor 20, to name a few. Although one or more systems may implement the process 800, in whole or in part, to simplify discussion, the process 800 will be described with respect to particular systems. Further, although the process 800 will be described with respect to a two stage multiplexer, it should be understood that the process 800 can be adapted to be performed with respect to a multiplexer of any number of stages. For example, the process 800 can be used with a one stage, three stage, or five stage multiplexer.

The process 800 begins at the block 802 where, for example, the baseband processor 40 receives a control signal from a base station identifying one or more communication frequencies. In some cases, the control signal is received by the triplexer 710, or a controller (not shown) included in the triplexer 710. In some embodiments, the block 802 may include one or more of the embodiments described with respect to the block 502.

At block 804, the baseband processor 40 (or other controller of the triplexer 710) configures a first filter stage based at least in part on the one or more communication frequencies. Configuring the first filter stage may include opening or closing one or more switches between an input port of the triplexer 710 and filters of the first filter stage. As previously described, the first filter stage may include the filters between the input port 302 and a second filter stage. For example, the filters 722 and 724 may be included in the first filter stage. However, in some cases, at least some of the filters of the first filter stage (such as the filter 722) may be connected between the input port 302 and a switch bank 406 and/or load bank 430.

In some cases, configuring the first filter stage may include configuring the switch bank 406 to connect a filter from the first filter stage (such as the filter 722) to a particular load included in the load bank 430. In some embodiments, the block 804 may be optional or omitted because, for example, the filters are configured to filter particular frequencies prior to processing by the second stage of filters.

At block 806, the baseband processor 40 configures a second filter stage based at least in part on the one or more communication frequencies. The second filter stage may include filters (such as the filters 726 and 728) located between the first filter stage and a switch bank 406. Configuring filters of the second filter stage may include connecting or disconnecting filters from the second filter stage to one or more signal paths of the triplexer 710. For example, the switch 734 may be opened to disconnect the filter 726 from the signal path. Advantageously, in certain embodiments, disconnecting particular filters may affect the isolation and insertion loss of other signal paths within the triplexer 710 enabling the triplexer to be configured to process a greater number of signal paths than traditional triplexers.

Further, configuring filters of the second filter stage may include connecting or disconnecting different load circuits included in the load bank 430 via the switch bank 406. As with the disconnecting of the different filters, the connecting of particular load circuits to the filters of the second filter bank may affect the isolation and insertion loss of signal paths within the triplexer 710 enabling the triplexer to be configured to process a greater number of signal paths than traditional triplexers.

At block 808, the baseband processor 40 configures a bypass circuit (such as the bypass circuit 730) based at least in part on the control signal. Configuring the bypass circuit may include connecting or disconnecting the bypass circuit from a signal path via, for example, the switch 732. Alternatively, or in addition, configuring the bypass circuit may include connecting the bypass circuit to a particular load circuit in the load bank 430 via the switch bank 406. In some embodiments, the triplexer may include multiple bypass circuits. In some such cases, the block 808 may include configuring the plurality of bypass circuits based on the frequencies identified by the control signal. In some cases, one bypass circuit may be connected and another may be disconnected from the signal paths of the triplexer 710. Other configurations of the bypass circuits are possible. For example, both bypass circuits may be connected to signal paths of the triplexer 710, but each bypass circuit may be connected to a different load circuit.

Although omitted to simplify the FIG. 8, the process 800 may include one or more of the processes described with respect to FIGS. 5 and 6. For example, the process 800 may include determining whether the control signal identified one or a plurality of frequencies or frequency bands. If a single frequency is identified, the second filter bank may be deactivated. For example, if the single frequency is below 960 MHz, in the example of FIG. 7A, the filter 722 may be used and the remaining filters may be disconnected. Disconnecting the remaining filters may include connecting the remaining filters to an open load and/or not connecting the remaining filters to an output port 404.

Further, the process 800 may include determining whether one or more filters identified based on the control signal are supported by the triplexer 710. If a frequency is not supported by the triplexer 710, the bypass path 730 may be connected to the signal path, and the remaining signal paths may be disconnected.

TERMINOLOGY

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The term "coupled" is used to refer to the connection between two elements, the term refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the inventions are not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A triplexer comprising:
a first filter bank including one or more filters, the first filter bank in communication with an input port of the triplexer;
a plurality of load circuits configured to reduce insertion loss in a communication path between the input port of the triplexer and an output port of the triplexer;
a switch bank including a plurality of switches;
a second filter bank including one or more filters, the second filter bank positioned between the first filter bank and the switch bank, the plurality of switches connecting the one or more filters of the second filter bank to a load circuit from the plurality of load circuits; and
a plurality of bypass circuits between the first filter bank and the switch bank enabling a signal to bypass the second filter bank and be provided to the switch bank, at least one bypass circuit of the plurality of bypass circuits being of a first type and at least one other bypass circuit of the plurality of bypass circuits being of a second type that differs from the first type.

2. The triplexer of claim 1 wherein the first filter bank includes a low pass filter and a high pass filter.

3. The triplexer of claim 1 wherein the second filter bank includes a low pass filter and a high pass filter.

4. The triplexer of claim 1 wherein at least one filter of the first filter bank and at least one filter of the second filter bank are connected in cascade.

5. The triplexer of claim 1 wherein the first filter bank and the second filter bank do not include a band pass filter.

6. The triplexer of claim 1 wherein the first filter bank and the second filter bank are connected in series with one or more additional filter bank stages.

7. The triplexer of claim 1 wherein the switch bank selectively connects a filter from the second filter bank to the load circuit from the plurality of load circuits based at least in part on a control signal from a baseband processor.

8. The triplexer of claim 1 further comprising a bypass switch between the first filter bank and the plurality of bypass circuits.

9. The triplexer of claim 8 wherein the bypass switch is closed when a non-carrier aggregation signal is received.

10. The triplexer of claim 1 wherein a first filter from the first filter bank is connected to the switch bank without being connected to the second filter bank and a second filter from the first filter bank is connected to the second filter bank.

11. The triplexer of claim 1 wherein a first bypass circuit of the plurality of bypass circuits is configured with respect to a first frequency band, and a second bypass circuit of the plurality of bypass circuits is configured with respect to a second frequency band.

12. The triplexer of claim 1 wherein the at least one bypass circuit of the first type is a phase shift network.

13. The triplexer of claim 1 further comprising a plurality of input ports including the input port, each input port of the plurality of input ports configured to receive a signal of a different frequency band.

14. A transceiver comprising:
a power amplifier module including a plurality of power amplifiers; and
a triplexer in communication with the power amplifier module, the triplexer including a first filter bank, a second filter bank, a plurality of load circuits, a switch bank, and a plurality of bypass circuits, the first filter bank in communication with an input port and including one or more filters, the second filter bank positioned between the first filter bank and the switch bank and including one or more filters, the plurality of load circuits configured to reduce insertion loss in a communication path between the input port of the triplexer and an output port of the triplexer, the switch bank including a plurality of switches that connect the one or more filters of the second filter bank to a load circuit from the plurality of load circuits, and the plurality of bypass circuits positioned between the first filter bank and the switch bank enabling a signal to bypass the second filter bank and be provided to the switch bank, at least one bypass circuit of the plurality of bypass circuits being of a first type and at least one other bypass circuit of the plurality of bypass circuits being of a second type that differs from the first type.

15. The transceiver of claim 14 wherein the plurality of load circuits includes a first set of load circuits selectively connectable to the bypass circuit based on a control signal.

16. The transceiver of claim 14 wherein the plurality of load circuits includes a second set of load circuits selectively connectable to the second filter bank based on a control signal.

17. The transceiver of claim 14 wherein at least one filter of the first filter bank is connected in series with at least one filter of the second filter bank.

18. The transceiver of claim 14 wherein the first filter bank and the second filter bank omit a band pass filter.

19. A wireless device comprising:

a transceiver including a power amplifier module and a triplexer, the power amplifier module including a plurality of power amplifiers and the triplexer in communication with the power amplifier module, the triplexer including a first filter bank, a second filter bank, a plurality of load circuits, a switch bank, and a plurality of bypass circuits, the first filter bank in communication with an input port and including one or more filters, the second filter bank positioned between the first filter bank and the switch bank and including one or more filters, the plurality of load circuits configured to reduce insertion loss in a communication path between the input port of the triplexer and an output port of the triplexer, the switch bank including a plurality of switches that selectively connect the one or more filters of the second filter bank to a load circuit from the plurality of load circuits based on a control signal, and the plurality of bypass circuits positioned between the first filter bank and the switch bank enabling a signal to bypass the second filter bank and be provided to the switch bank, at least one bypass circuit of the plurality of bypass circuits being of a first type and at least one other bypass circuit of the plurality of bypass circuits being of a second type that differs from the first type; and a baseband processor configured to provide the control signal to the triplexer, the control signal determined based at least in part on a communication from a base station.

20. The triplexer of claim 1 further comprising at least one additional bypass circuit that is separate from the plurality of bypass circuits, the plurality of bypass circuits configured with respect to a first frequency band, and the at least one additional bypass circuit configured with respect to a second frequency band.

21. The triplexer of claim 1 wherein a switch in the switch bank connects at least one bypass circuit of the plurality of bypass circuits to a load circuit from the plurality of load circuits when a control signal associated with a carrier aggregation mode is received and connects the at least one bypass path to an output of the triplexer when a control signal associated with a non-carrier aggregation mode is received.

* * * * *